(12) United States Patent
Kojima

(10) Patent No.: US 9,786,747 B2
(45) Date of Patent: Oct. 10, 2017

(54) WIRING SUBSTRATE, MANUFACTURING METHOD OF WIRING SUBSTRATE AND ELECTRONIC COMPONENT DEVICE

(71) Applicant: SHINKO ELECTRIC INDUSTRIES CO., LTD., Nagano-shi, Nagano (JP)

(72) Inventor: Hironari Kojima, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/154,072

(22) Filed: May 13, 2016

(65) Prior Publication Data
US 2016/0343654 A1    Nov. 24, 2016

(30) Foreign Application Priority Data

May 19, 2015  (JP) .................................. 2015-101525

(51) Int. Cl.
*H01L 29/34*     (2006.01)
*H01L 25/10*     (2006.01)

(52) U.S. Cl.
CPC ............ *H01L 29/34* (2013.01); *H01L 25/105* (2013.01); *H01L 2224/16227* (2013.01); *H01L 2224/32225* (2013.01); *H01L 2224/73204* (2013.01); *H01L 2225/1023* (2013.01); *H01L 2225/1058* (2013.01); *H01L 2924/1533* (2013.01); *H01L 2924/15153* (2013.01); *H01L 2924/15313* (2013.01)

(58) Field of Classification Search
CPC ....... H01L 23/528; H01L 23/66; H01L 29/34; H01L 21/768; H01L 2223/6611

USPC .......................................................... 257/773
See application file for complete search history.

(56) References Cited

U.S. PATENT DOCUMENTS

| | | | | |
|---|---|---|---|---|
| 5,021,296 A | * | 6/1991 | Suzuki | ................... H05K 3/384 361/748 |
| 8,288,875 B2 | * | 10/2012 | Shimizu | .............. H01L 21/4857 257/698 |
| 2010/0065322 A1 | * | 3/2010 | Ogawa | .................. H01L 21/563 174/262 |
| 2012/0018876 A1 | * | 1/2012 | Wu | ..................... H01L 21/6835 257/737 |

FOREIGN PATENT DOCUMENTS

| | | |
|---|---|---|
| JP | 7-202419 | 8/1995 |
| JP | 2002-374066 | 12/2002 |
| JP | 2010-067887 | 3/2010 |

\* cited by examiner

*Primary Examiner* — Yasser A Abdelaziez
(74) *Attorney, Agent, or Firm* — Rankin, Hill & Clark LLP

(57) ABSTRACT

A wiring substrate includes an insulation layer having an electronic component mounting area, and a wiring layer embedded in the insulation layer, the wiring layer having a first surface exposed from the insulation layer, to which a terminal of an electronic component is to be connected, a second surface opposite to the first surface, which is covered by the insulation layer, and a side surface. The second surface has a roughened surface and the side surface has a roughened surface, and a surface roughness of the second surface of the wiring layer is greater than a surface roughness of the side surface.

14 Claims, 30 Drawing Sheets

SURFACE ROUGHNESS OF SECOND SURFACE S2 > SURFACE ROUGHNESS OF SIDE SURFACE B
(PARTIALLY ENLARGED SECTIONAL VIEW)

FIG. 1A
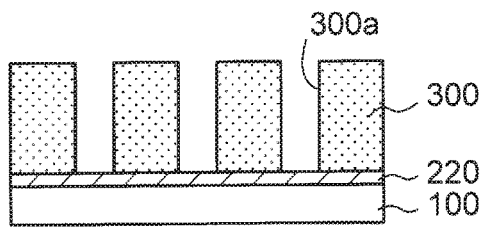
FIG. 1B
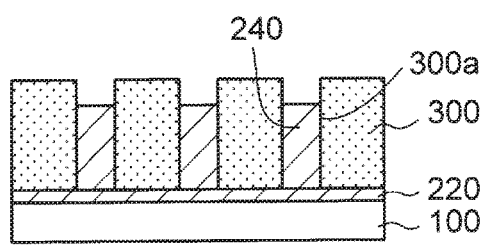
FIG. 1C
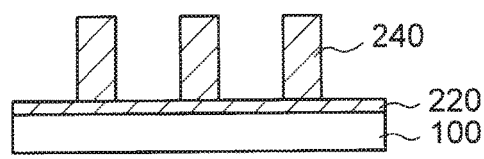
FIG. 1D
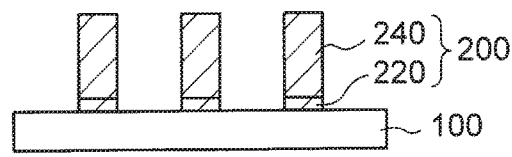
FIG. 1E
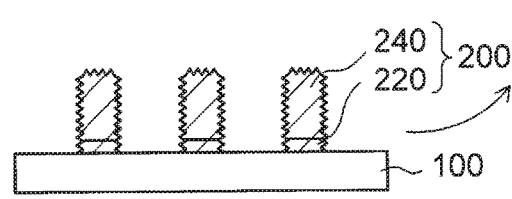
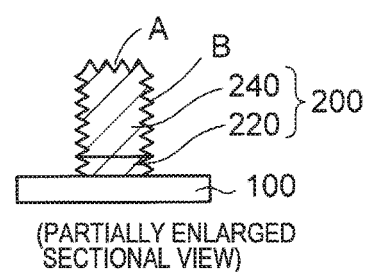
(PARTIALLY ENLARGED SECTIONAL VIEW)

FIG. 4
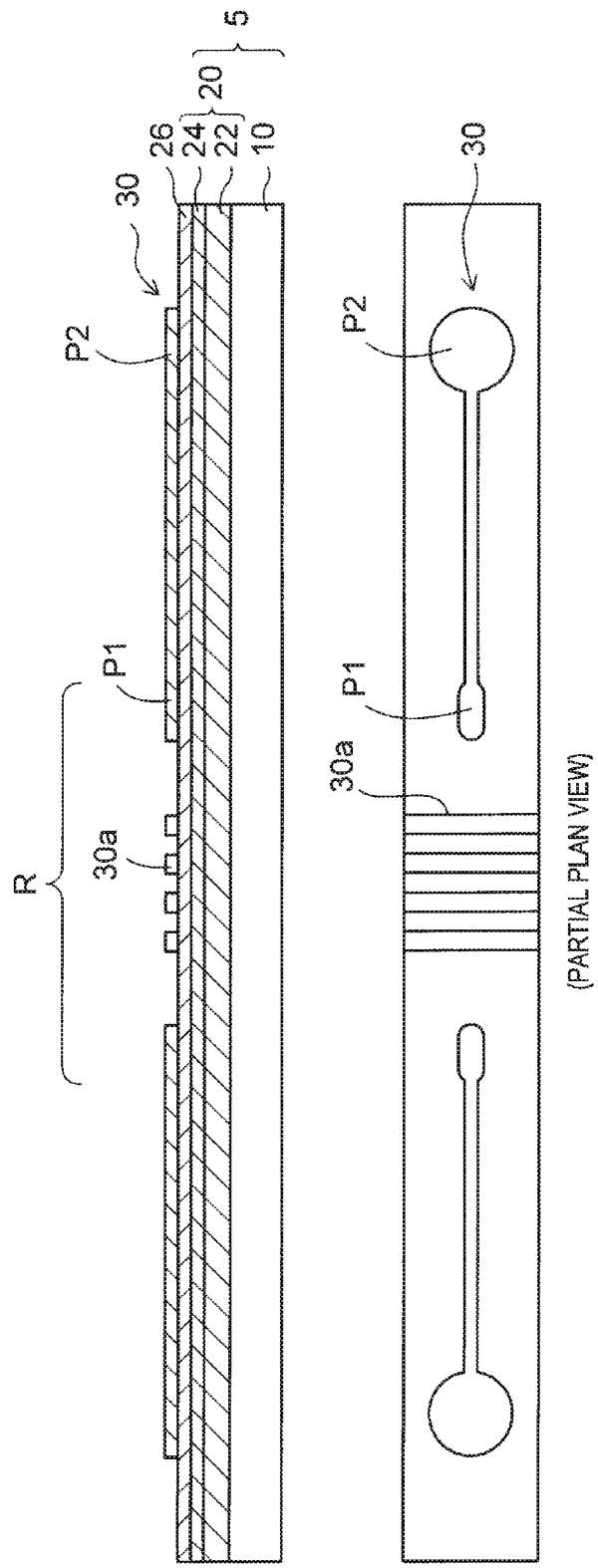
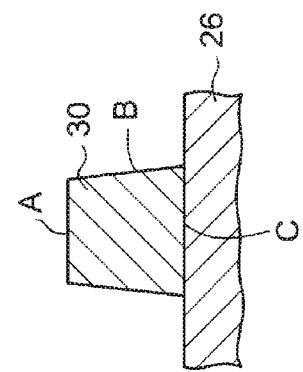

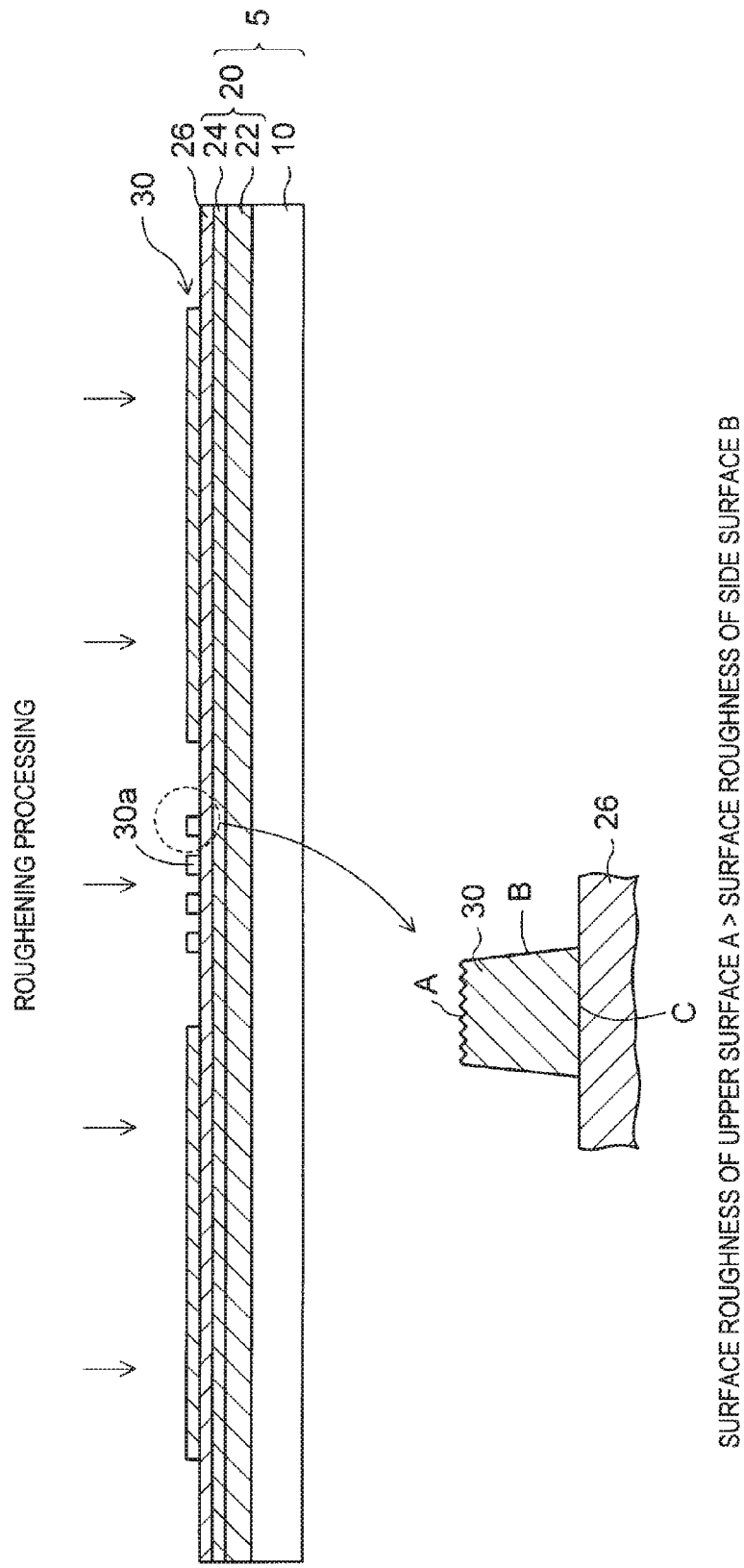

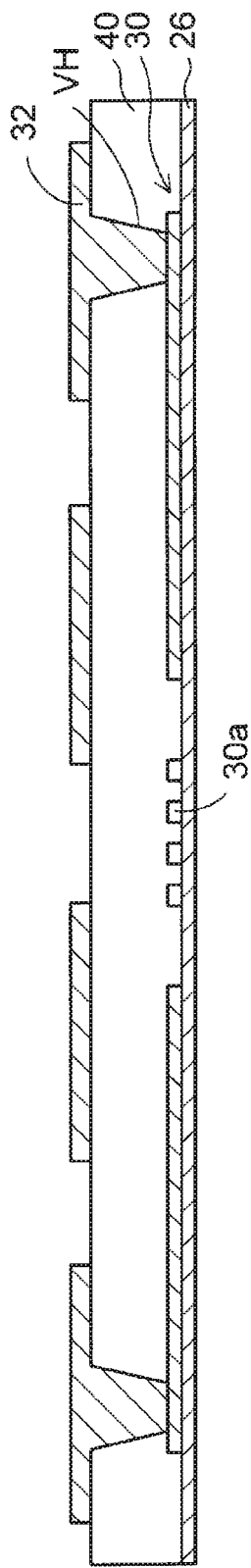
FIG. 8A
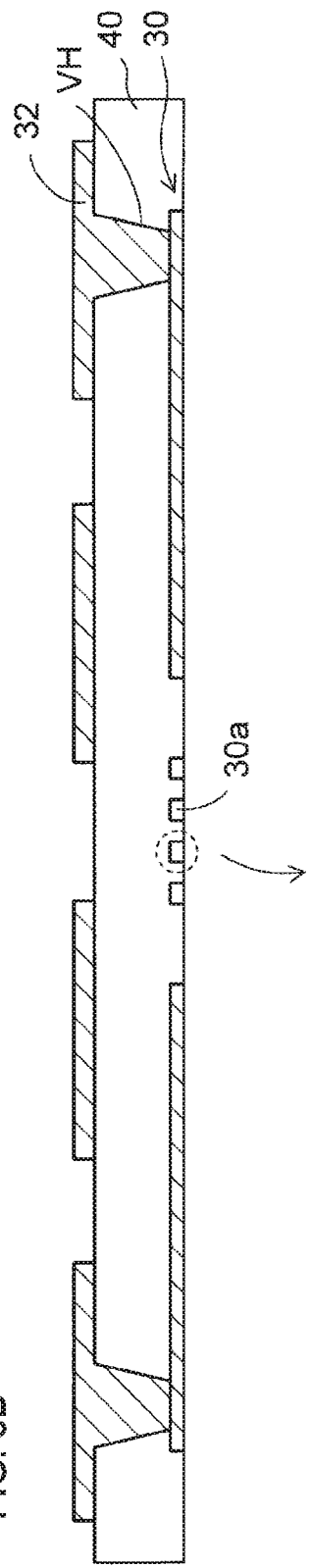
FIG. 8B
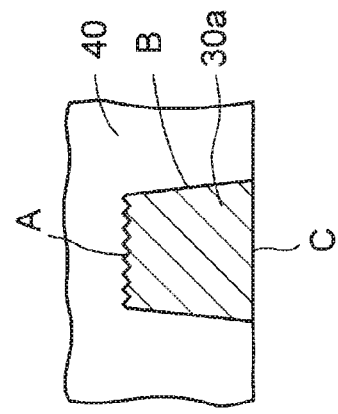
(PARTIALLY ENLARGED SECTIONAL VIEW)

FIG. 11
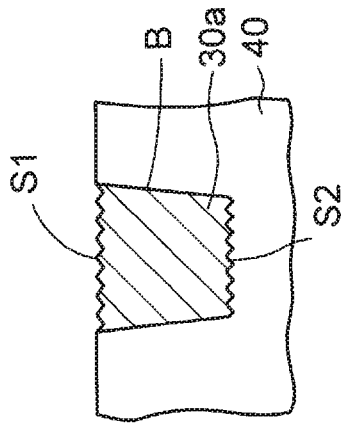
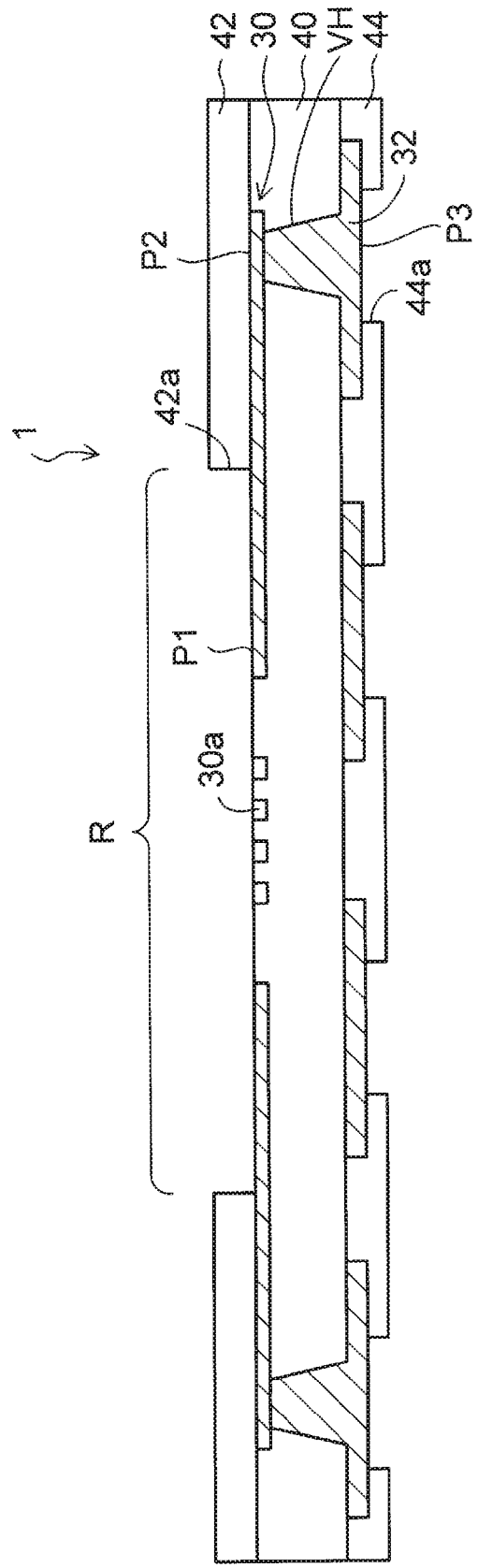
SURFACE ROUGHNESS OF SECOND SURFACE S2 > SURFACE ROUGHNESS OF SIDE SURFACE B
(PARTIALLY ENLARGED SECTIONAL VIEW)

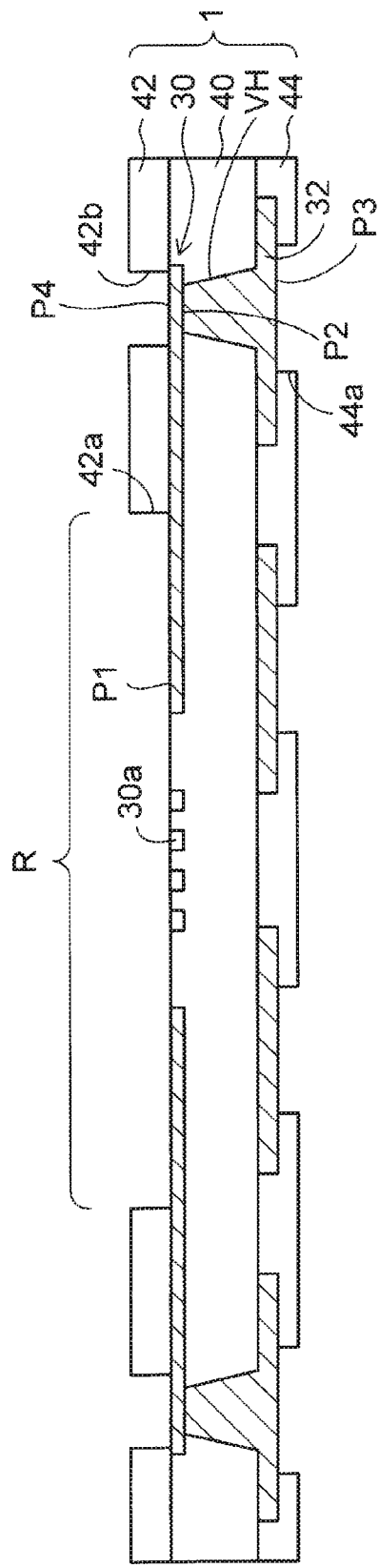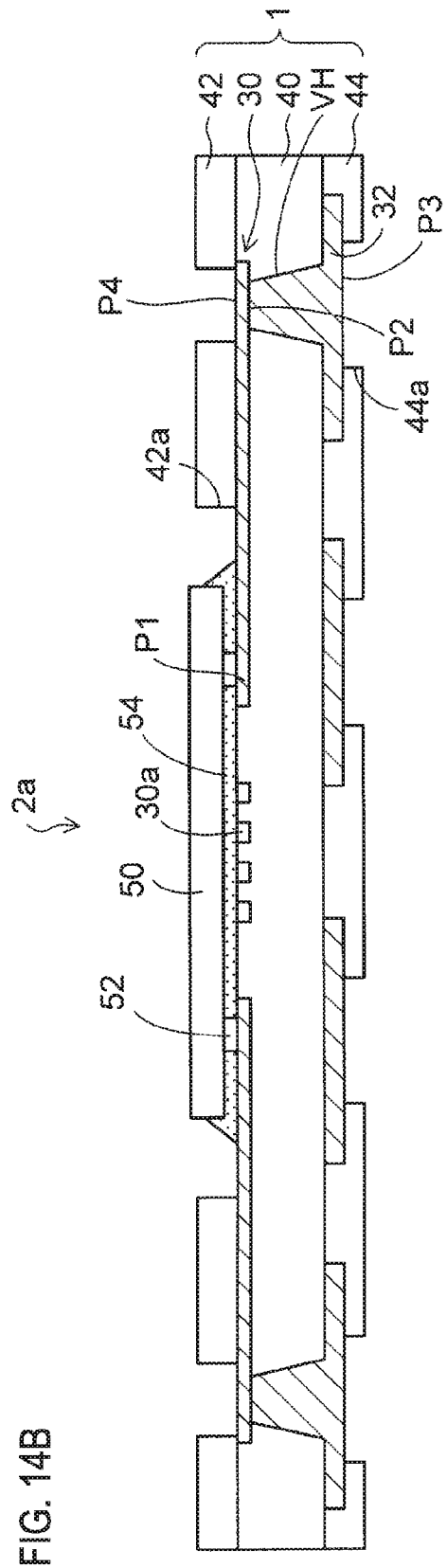

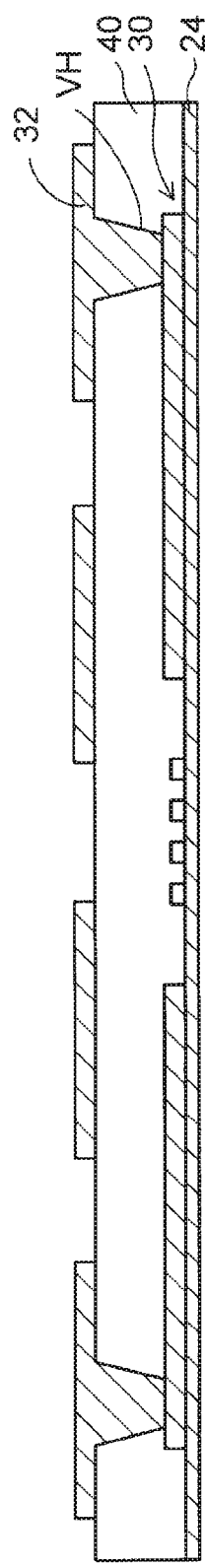
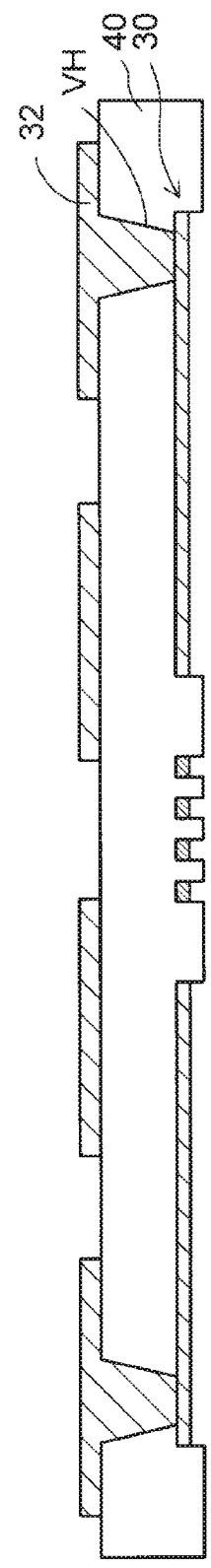

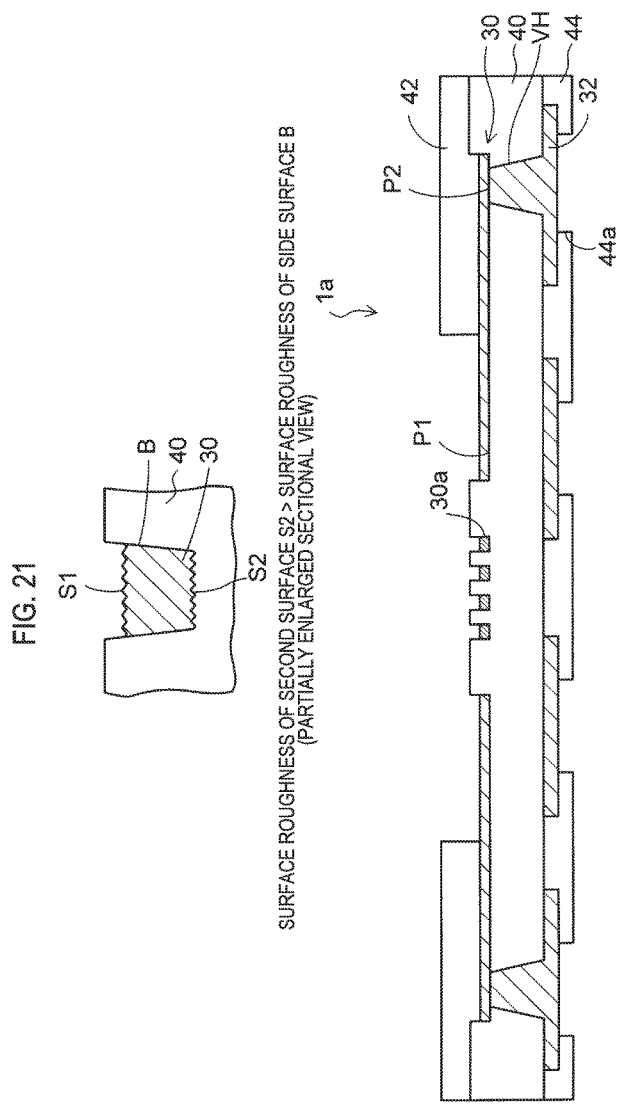

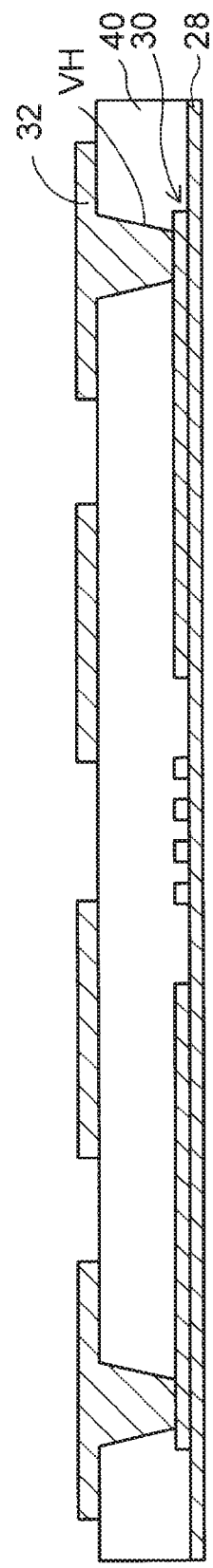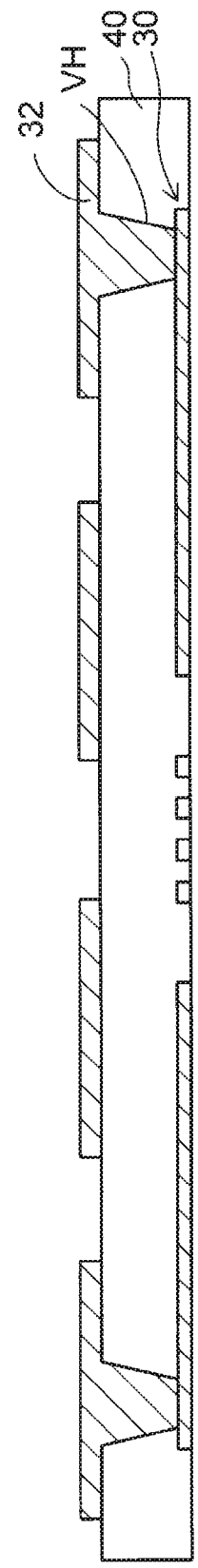

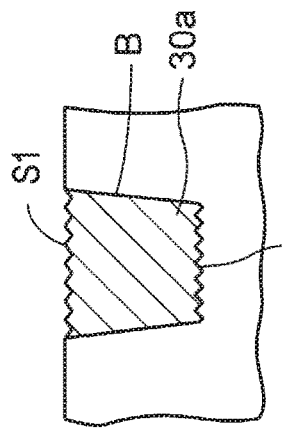
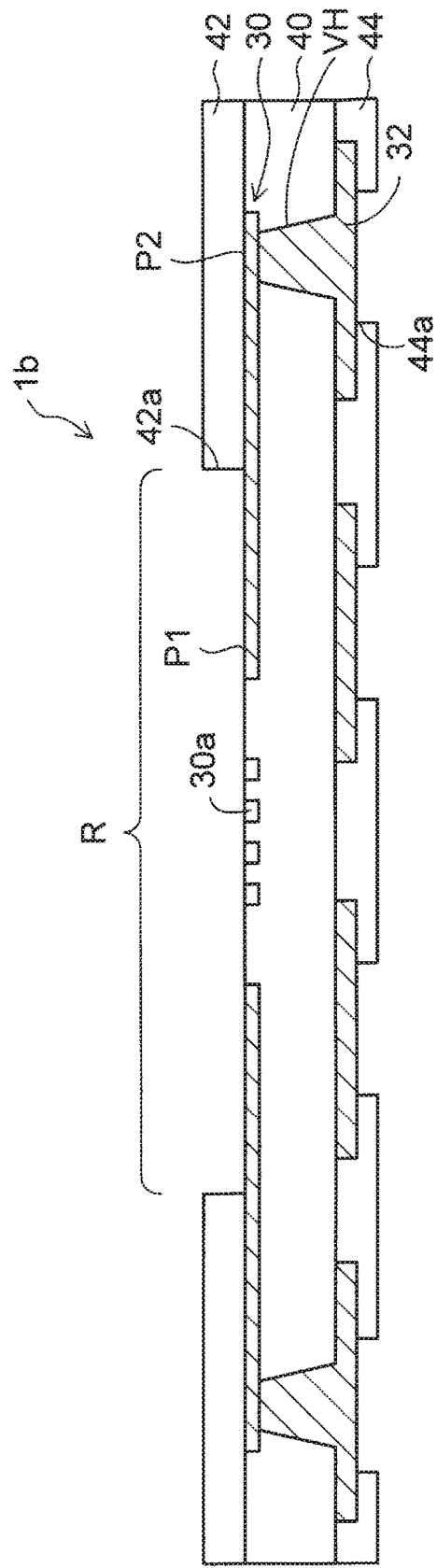
FIG. 25
SURFACE ROUGHNESS OF SECOND SURFACE S2 > SURFACE ROUGHNESS OF SIDE SURFACE B
(PARTIALLY ENLARGED SECTIONAL VIEW)

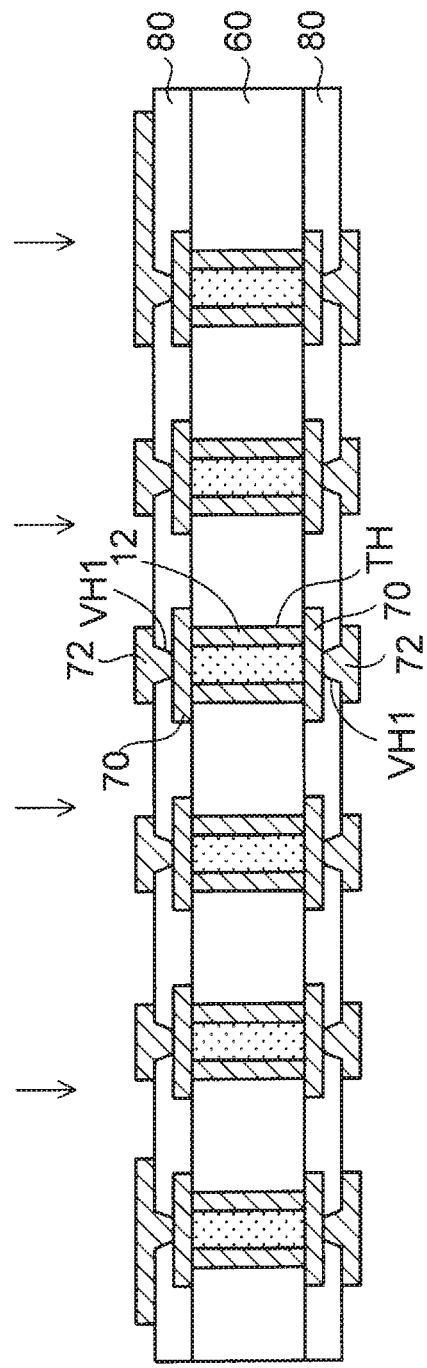
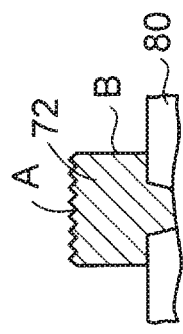
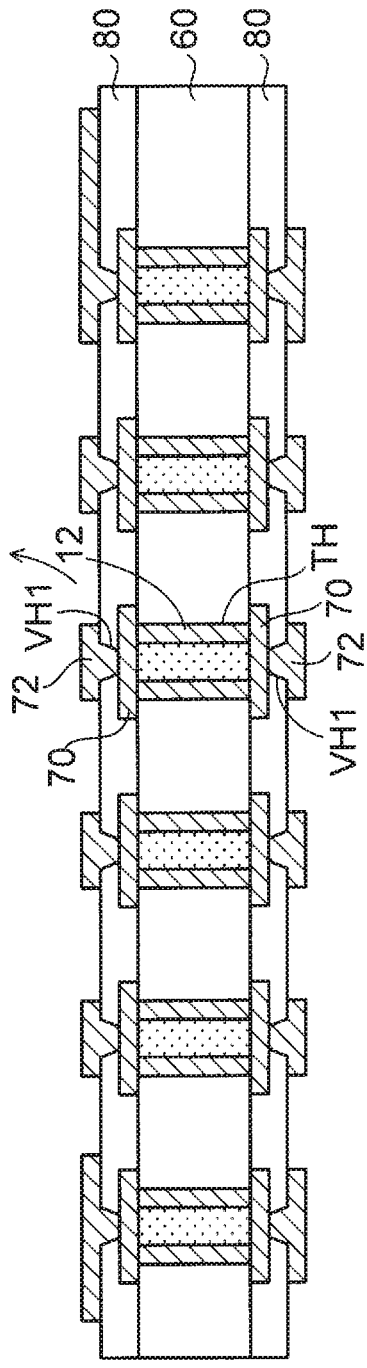
FIG. 27A
FIG. 27B

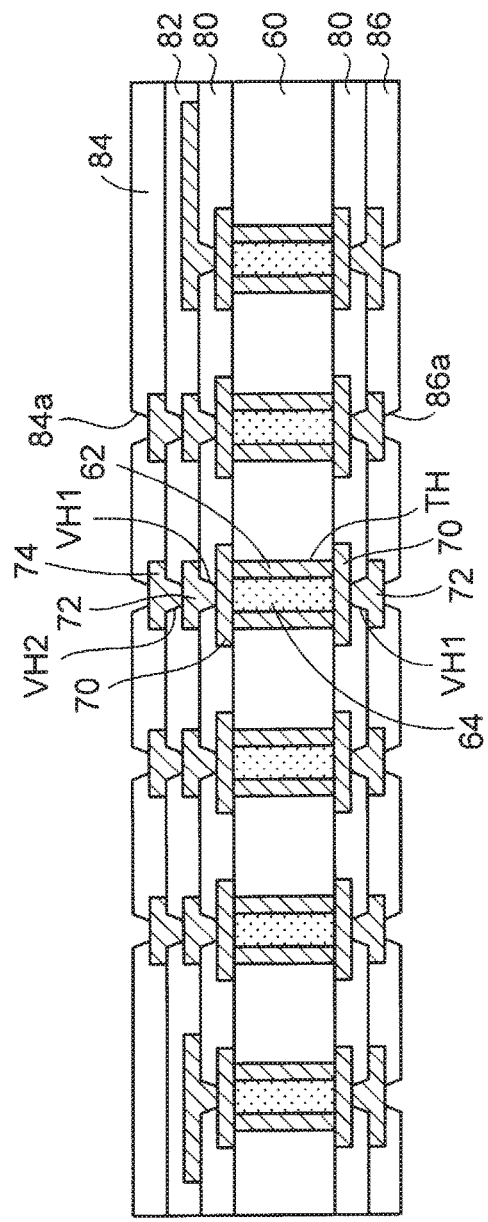
FIG. 30
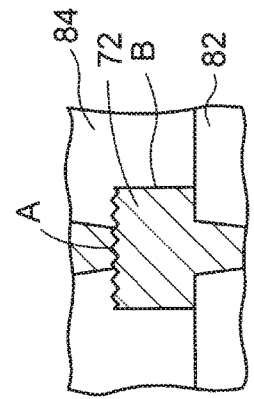
SURFACE ROUGHNESS OF UPPER SURFACE A > SURFACE ROUGHNESS OF SIDE SURFACE B
(PARTIALLY ENLARGED SECTIONAL VIEW)

WIRING SUBSTRATE, MANUFACTURING METHOD OF WIRING SUBSTRATE AND ELECTRONIC COMPONENT DEVICE

CROSS-REFERENCE TO RELATED APPLICATION

The present application claims priority from Japanese Patent Application No. 2015-101525 filed on May 19, 2015, the entire content of which is incorporated herein by reference.

BACKGROUND

Technical Field

The present disclosure relates to a wiring substrate, a manufacturing method of the wiring substrate and an electronic component device.

Related Art

In the related art, a wiring substrate for mounting thereon electronic components such as a semiconductor chip has been known. In the wiring substrate, a bump of the semiconductor chip is flip chip-connected to a connection pad of the wiring substrate through a soldering.

[Patent Document 1] Japanese Patent Application Publication No. Hei. 7-202419A
[Patent Document 2] Japanese Patent Application Publication No. 2002-374066A
[Patent Document 3] Japanese Patent Application Publication No. 2010-67887A As described later in paragraphs of preliminary matters, in the wiring substrate, an upper surface and side surfaces of a wiring layer are formed with unevenness having the same surface roughness by roughening processing so as to secure adhesiveness between the wiring layer and an insulation layer.

For this reason, in the wiring substrate that is to be used in a high-frequency band, propagation loss of a high-frequency signal increases due to an influence of the unevenness of the wiring layer.

SUMMARY

Exemplary embodiments of the invention provide a wiring substrate having a wiring layer capable of securing adhesiveness of an insulation layer and reducing propagation loss of a high-frequency signal, a manufacturing method of the wiring substrate and an electronic component device.

A wiring substrate according to an exemplary embodiment of the invention, comprises:

an insulation layer having an electronic component mounting area; and a wiring layer embedded in the insulation layer, the wiring layer having a first surface exposed from the insulation layer, to which a terminal of an electronic component is to be connected, a second surface opposite to the first surface, which is covered by the insulation layer, and a side surface, wherein the second surface of the wiring layer has a roughened surface and the side surface of the wiring layer has a roughened surface, and a surface roughness of the second surface of the wiring layer is greater than a surface roughness of the side surface.

A manufacturing method of a wiring substrate according to an exemplary embodiment of the invention, comprises:

forming a wiring layer on a base layer;

roughening the wiring layer by a roughening processing solution so that a surface roughness of an upper surface of the wiring layer is greater than a surface roughness of a side surface thereof; and forming an insulation layer on the base layer and the wiring layer.

According to the disclosure to be described later, the wiring layer is embedded in the insulation layer, and the first surface of the wiring layer is exposed from the insulation layer. Also, the second surface opposite to the first surface of the wiring layer and the side surface are embedded in the insulation layer. The terminal of the electronic component is connected to the first surface of the wiring layer. Also, the surface roughness of the second surface of the wiring layer is set to be higher than the surface roughness of the side surface.

Since the second surface of the wiring layer is sufficiently roughened, the sufficient adhesion strength of the insulation layer is obtained. Also, since the side surface of the first wiring layer has the smaller unevenness than the second surface, it is possible to reduce the propagation loss of the high-frequency signal.

BRIEF DESCRIPTION OF THE DRAWINGS

FIGS. 1A to 1E are sectional views depicting a formation method of a wiring layer relating to preliminary matters.

FIG. 4 is a sectional view and a plan view depicting the manufacturing method of the wiring substrate according to the first exemplary embodiment (3).

FIG. 5 is a sectional view depicting the manufacturing method of the wiring substrate according to the first exemplary embodiment (4).

FIGS. 8A and 8B are sectional views depicting the manufacturing method of the wiring substrate according to the first exemplary embodiment (7).

FIG. 11 is a sectional view depicting the wiring substrate according to the first exemplary embodiment.

FIGS. 14A and 14B are sectional views depicting an electronic component device of the first modified example of the first exemplary embodiment (1).

FIGS. 19A and 19B are sectional views depicting the manufacturing method of the wiring substrate according to the second exemplary embodiment (2).

FIG. 21 is a sectional view depicting a wiring substrate of the second exemplary embodiment.

FIGS. 23A and 23B are sectional views depicting the manufacturing method of the wiring substrate according to the third exemplary embodiment (2).

FIG. 25 is a sectional view depicting a wiring substrate of the third exemplary embodiment.

FIGS. 27A and 27B are sectional views depicting the manufacturing method of the wiring substrate according to the fourth exemplary embodiment (2).

FIG. 30 is a sectional view depicting a wiring substrate of the fourth exemplary embodiment.

DETAILED DESCRIPTION

Figure 2A:
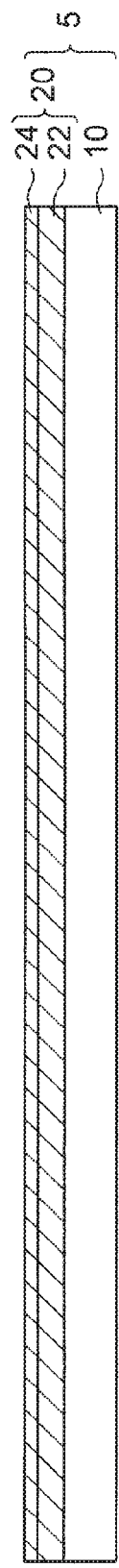
FIGS. 2A and 2B are sectional views depicting a manufacturing method of a wiring substrate according to a first exemplary embodiment (1).

Hereinafter, exemplary embodiments will be described with reference to the accompanying drawings.

Before describing the exemplary embodiments, preliminary matters, which are bases of the disclosure, are first described. FIGS. 1A to 1E are sectional views depicting a method of forming a wiring layer by a semi-additive method in accordance with the preliminary matters. It should be noted that the method of forming a wiring layer in accordance with the preliminary matters includes a personal test result of the inventor and is not a known technology.

In the method of forming a wiring layer in accordance with the preliminary matters, as shown in FIG. 1A, after forming a seed layer 220 on an insulation layer 100, a plating resist layer 300 having necessary openings 300a arranged therein is formed on the seed layer 220.

Then, as shown in FIG. 1B, a copper plated layer 240 is formed in the openings 300a of the plating resist layer 300 by an electrolytic plating in which the seed layer 220 is used for a plating power feeding path.

Then, as shown in FIG. 1C, the plating resist layer 300 is removed.

Then, as shown in FIG. 1D, the seed layer 220 is removed by wet etching while using the copper plated layer 240 as a mask. Thereby, a wiring layer 200 is formed from the seed layer 220 and the copper plated layer 240.

Then, as shown in FIG. 1E, an upper surface and side surfaces of the wiring layer 200 are roughened so as to form an insulation layer on the wiring layer 200 with good adhesiveness. In the roughening process, a spray etching apparatus is used to spray a roughening processing solution to the wiring layer 200. Thereby, as shown in a partially enlarged sectional view of FIG. 1E, the upper surface A and the side surfaces B of the wiring layer 200 are roughened.

At this time, the upper surface A and the side surfaces B of the wiring layer 200 are roughened to have substantially the same surface roughness (Ra). The surface roughness (Ra) of the upper surface A and the side surfaces B of the wiring layer 200 is set to 300 to 500 nm, for example.

As conditions of the roughening processing for roughening the upper surface A and the side surfaces B of the wiring layer 200 to have substantially the same surface roughness Ra, following conditions are used.

apparatus: spray etching apparatus
temperature of roughening processing solution: 30° C.
spray pressure: 0.2 MPa
copper concentration in roughening processing solution: 25 g/l (liter)

When the upper surface A and the side surfaces B of the wiring layer 200 are roughened, unevenness is formed over the entirety of the upper surface A and the side surfaces B of the wiring layer 200.

In a wiring substrate that is to be used in a high-frequency band, a surface effect that a signal is transmitted in the vicinity of a surface of the wiring layer and is not transmitted well in the vicinity of a center of the wiring layer occurs. For this reason, when the unevenness is formed on the upper surface A and the side surfaces B of the wiring layer 200, since the signal is transmitted along the unevenness of the wiring layer 200, a moving distance increases and thus propagation loss increases.

Therefore, the wiring substrate that is to be used in the high-frequency band requires an insulation layer to be formed with good adhesiveness and a wiring layer in which propagation loss of a high-frequency signal is reduced.

A wiring substrate, a manufacturing method of the wiring substrate and an electronic component device of exemplary embodiments, which will be described later, can solve the above problems.

First Exemplary Embodiment

Figure 12A:
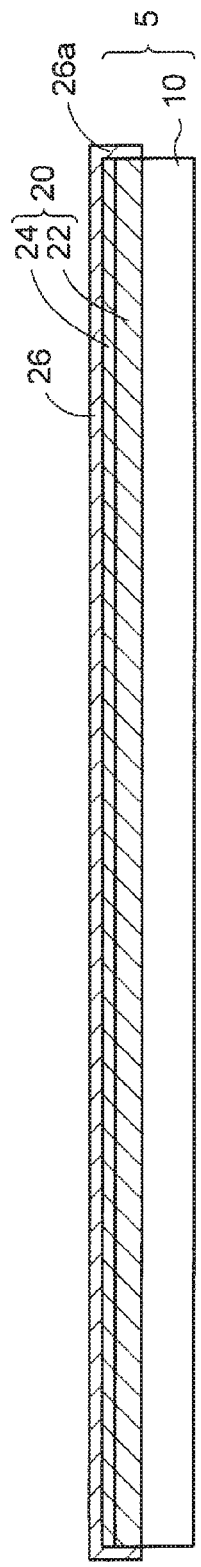
FIGS. 12A to 12C are sectional views depicting a manufacturing method of a wiring substrate according to a modified example of the first exemplary embodiment.
Figure 12B:
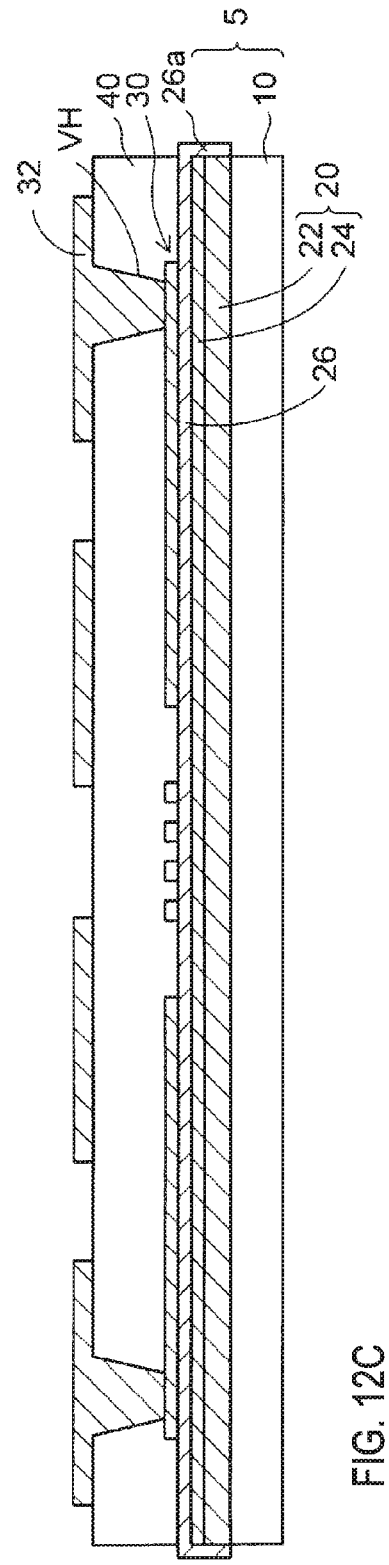
Figure 12C:
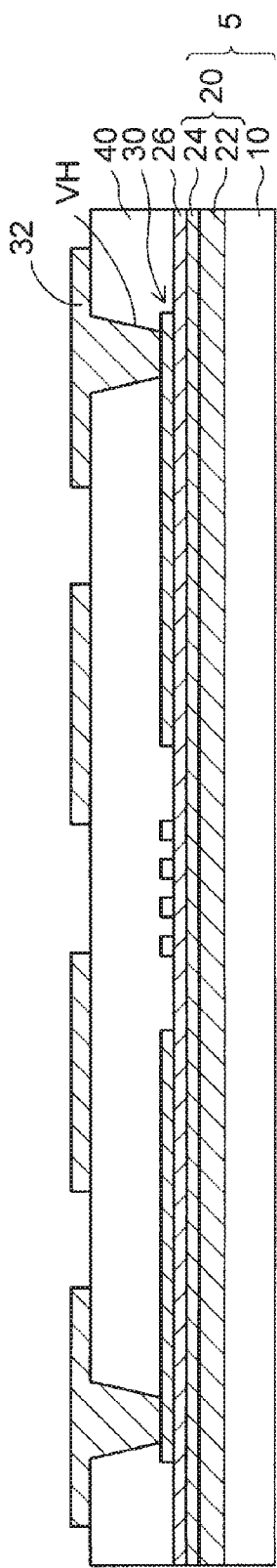

FIGS. 2A to 10 depict a manufacturing method of a wiring substrate in accordance with a first exemplary embodiment, FIG. 11 depicts a wiring substrate of the first exemplary embodiment, FIGS. 12A to 12C depict a manufacturing method of a wiring substrate in accordance with a modified example, and FIGS. 13 to 17 depict an electronic component device of the first exemplary embodiment.

In the below, structures of the wiring substrate and the electronic component device are described while explaining the manufacturing method of the wiring substrate and the electronic component device.

In the manufacturing method of the wiring substrate of the first exemplary embodiment, as shown in FIG. 2A, a stacked substrate 5 in which a copper foil 20 having a carrier is bonded on a prepreg 10 is first prepared. The prepreg 10 is a composite material in which a resin is impregnated in glass fibers, carbon fibers, aramid fibers or the like. The copper foil 20 having a carrier includes a carrier copper foil 22 arranged on the prepreg 10-side and a thin film copper foil 24 arranged thereon.

The carrier copper foil 22 functions as a carrier for facilitating handling of the thin film copper foil 24.

In the meantime, regarding the carrier copper foil 22 and the thin film copper foil 24, a variety of metal foils such as aluminum foil can be used as substitutes.

A thickness of the prepreg 10 is 50 μm to 500 μm, for example. Also, a thickness of the carrier copper foil 22 is 12 μm to 70 μm, and a thickness of the thin film copper foil 24 is 2 μm to 5 μm.

In the stacked substrate 5, a release agent (not shown) is formed between the carrier copper foil 22 and the thin film copper foil 24, so that the carrier copper foil 22 and the thin film copper foil 24 can be easily peeled off at an interface therebetween. As the release agent, a silicone-based release agent or a fluorine-based release agent is used.

Figure 2B:
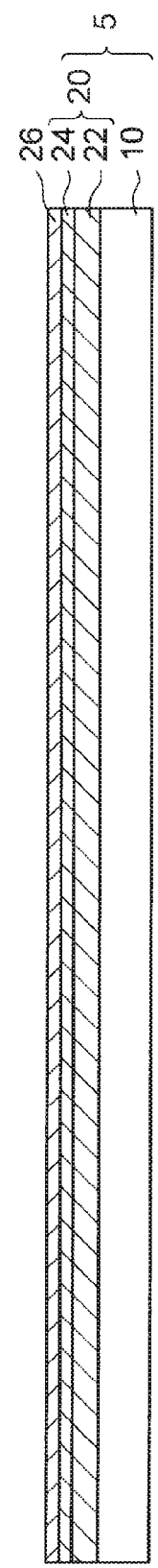

Then, as shown in FIG. 2B, a nickel layer 26 is formed on the thin film copper foil 24 by an electrolytic plating. A thickness of the nickel layer 26 is 2 μm to 5 μm, for example. As described later, the nickel layer 26 functions as an etching stop layer when wet-etching the thin film copper foil 24 after the carrier copper foil 22 and the thin film copper foil 24 are peeled off from the interface therebetween.

Figure 3A:
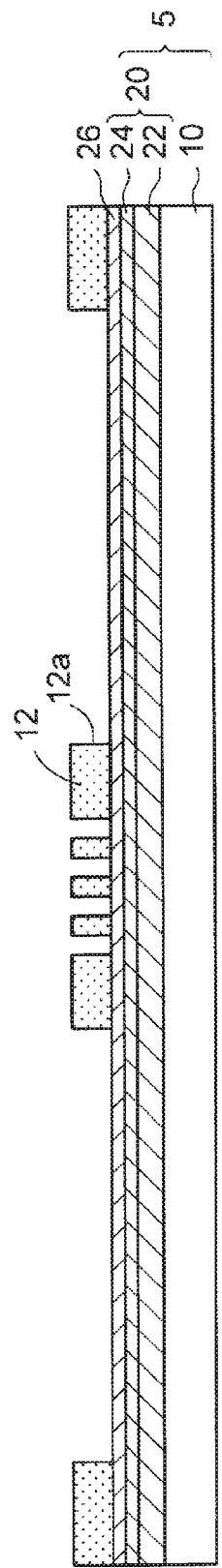
FIGS. 3A and 3B are sectional views depicting the manufacturing method of the wiring substrate according to the first exemplary embodiment (2).

Subsequently, as shown in FIG. 3A, a plating resist layer 12 having openings 12a formed in an area, in which a first wiring layer is to be arranged, is formed on the nickel layer 26.

In the first exemplary embodiment, as a base layer for forming the first wiring layer, the stacked substrate 5 having the nickel layer 26 formed thereon is used.

In the first exemplary embodiment, the base layer for forming the first wiring layer preferably has a structure where the base layer will be later selectively removed with respect to the first wiring layer (copper) to expose a lower surface of the first wiring layer (copper). For this reason, the base layer has the nickel layer 26 on the top. In addition to the nickel layer 26, a metal layer having a characteristic that it can be selectively wet-etched with respect to the first wiring layer (copper) can also be used.

Figure 3B:
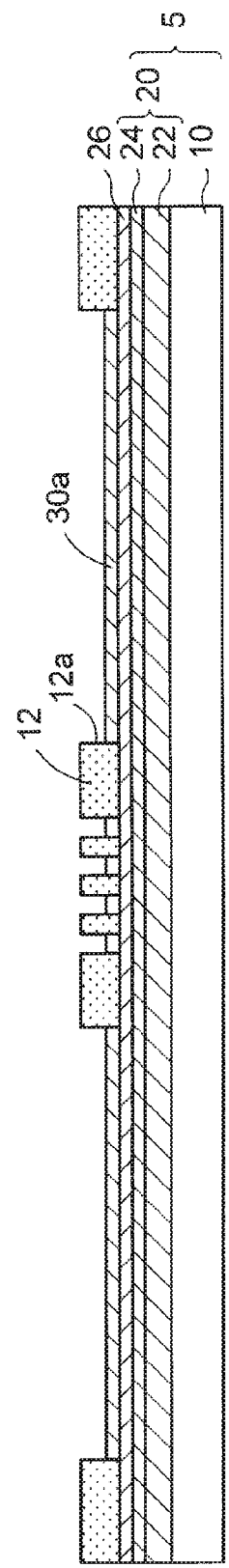

Then, as shown in FIG. 3B, a metal plated layer 30a formed of copper or the like is formed in the openings 12a of the plating resist layer 12 by an electrolytic plating in which the nickel layer 26 is used for a plating power feeding path.

Subsequently, as shown in FIG. 4, the plating resist layer 12 is removed. Thereby, a first wiring layer 30 is formed from the metal plated layer 30a. The first wiring layer 30 is entirely formed of the same metal.

When using the stacked substrate 5 for plural products, a plurality of product areas is defined in the stacked substrate 5. In FIG. 4, one product area of the stacked substrate 5 is shown, and a central portion thereof is an electronic component mounting area R.

As shown in a partial plan view of FIG. 4, the first wiring layer 30 has an electronic component mounting pad P1 and a via receiving pad P2. Also, the first wiring layer 30 is formed to include a fine wiring part 30a arranged at a central portion of the electronic component mounting area R.

As shown in a partially enlarged sectional view of FIG. 4, the first wiring layer 30 has a rectangular sectional shape, and possesses an upper surface A, a lower surface C and side surfaces B connected to the upper and lower surfaces.

Subsequently, as shown in FIG. 5, the first wiring layer 30 is subjected to the roughening processing. In the first exemplary embodiment, conditions with which only the upper surface A of the first wiring layer 30 is sufficiently roughened and the side surfaces B are difficult to be roughened are adopted. As the roughening conditions, following conditions are exemplified.

apparatus: spray etching apparatus
roughening processing solution: formic acid-based aqueous solution
temperature of roughening processing solution: 25° C.
spray pressure: 0.1 MPa
copper concentration in roughening processing solution: 15 g/l (liter)

In the spray etching apparatus (not shown), the roughening processing solution is sprayed in a direction indicated by arrows in FIG. 5 (in a direction perpendicular to the surface to be roughened) with a predetermined pressure from a nozzle disposed above a chamber, thereby wet-etching and roughening a target.

In this way, the spray conditions of the roughening processing solution of the spray etching apparatus are adjusted so that a surface roughness of the upper surface A of the first wiring layer 30 is greater than a surface roughness of the side surface B, and the first wiring layer 30 is correspondingly roughened.

In the roughening conditions of the first exemplary embodiment, the temperature of the roughening processing solution is lowered from 30° C. to 25° C., as compared to the roughening conditions of the preliminary matters. Also, the spray pressure is lowered from 0.2 MPa to 0.1 MPa. Further, the copper concentration in the roughening processing solution is lowered from 25 g/l to 15 g/l.

By the above roughening conditions, it is possible to lower an etching rate of copper by the roughening processing solution. The etching rate is an etching amount of copper per unit time. The etching rate of copper in the roughening conditions of the preliminary matters is about 1 μm/minute, and the etching rate of copper in the roughening conditions of the first exemplary embodiment is lowered to about 0.5 μm/minute.

Also, since the spray pressure is lowered, the roughening processing solution is less supplied to the side surfaces B of the first wiring layer 30.

Thereby, the roughening on the side surfaces B of the first wiring layer 30 is suppressed. In the meantime, even when the etching rate of copper is lowered, since the roughening processing solution is supplied to the upper surface A of the first wiring layer 30 with a constant pressure, it is possible to sufficiently roughen the upper surface A of the first wiring layer 30.

In this way, the roughening conditions are set so that the etching rate of the side surface B of the first wiring layer 30 is lower than the etching rate of the upper surface A. Thereby, it is possible to set the surface roughness of the upper surface A of the first wiring layer 30 greater than the surface roughness of the side surface B.

As the optimal roughening conditions, the above-described conditions are exemplified. However, according to a test result of the inventor, a range of the spray pressure is preferably greater than 0.08 MPa and less than 0.14 MPa, and more preferably 0.1 MPa or greater and 0.12 MPa or less.

If the spray pressure is set to 0.14 MPa or higher, a difference between the surface roughness of the upper surface A and the side surface B of the first wiring layer 30 is reduced, which is not favorable.

Also, if the spray pressure is set to 0.08 MPa or less, the etching rate is excessively lowered, so that it is not possible to form an efficient roughened surface.

Also, a favorable range of the temperatures under the condition of the spray pressure is 25° C. to 30° C. Also, a range of the copper concentrations under the condition of the spray pressure is 15 g/l to 18 g/l.

By the above conditions, the surface roughness (Ra) of the upper surface A of the first wiring layer 30 is set within a range of 100 nm to 500 nm, and particularly preferably a range of 390 nm to 450 nm. Also, the surface roughness (Ra) of the side surface B of the first wiring layer 30 is set within a range of 50 nm to 300 nm, and particularly preferably a range of 250 nm to 300 nm. Preferably, the surface roughness of the upper surface A is 1.5 to 5 times as large as the surface roughness of the side surface B.

As described above, according to the first exemplary embodiment, the upper surface A of the first wiring layer 30 is sufficiently roughened so as to secure the sufficient adhesion strength of an insulation layer to be formed on the upper surface thereof. In the meantime, the side surfaces of the first wiring layer 30 are suppressed from being roughened and are made to be relatively flat surfaces, so that it is possible to reduce the propagation loss of the high-frequency signal.

In the meantime, when forming the wiring layer by the general semi-additive method, a process of etching a seed layer while using the copper plated layer as a mask is used. Since the seed layer has the higher etching rate than the copper plated layer, the seed layer is likely to have an undercut shape in which the seed layer is cut inwardly.

In the first exemplary embodiment, since the first wiring layer 30 is formed of only the metal plated layer 30a and the process of etching the seed layer is not performed, the undercut is not caused at a base part of the first wiring layer 30. Therefore, it is possible to form a finer wiring layer.

However, as described later in a fourth exemplary embodiment, a wiring layer that is to be formed by the semi-additive method may be roughened by the same conditions.

Figure 6A:
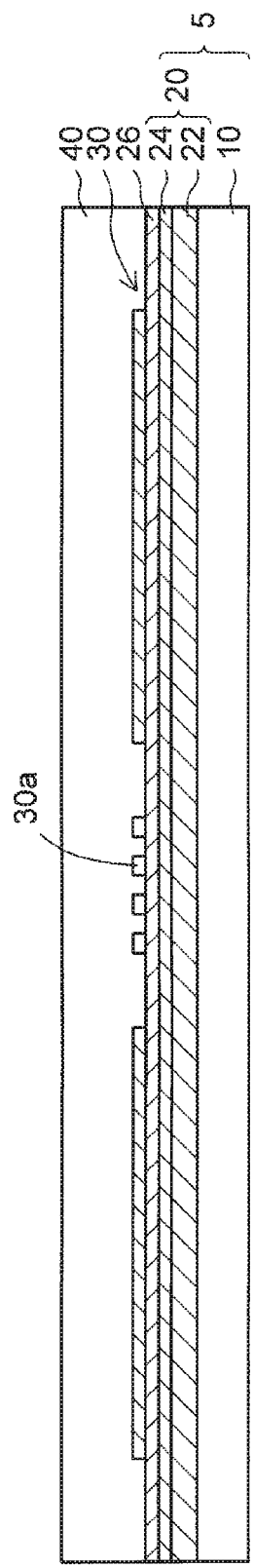
FIGS. 6A and 6B are sectional views depicting the manufacturing method of the wiring substrate according to the first exemplary embodiment (5).

Subsequently, as shown in FIG. 6A, a non-cured resin film is bonded on the first wiring layer 30 and the nickel layer 26 and is cured by heating, so that an insulation layer 40 is formed. As the resin film, an epoxy resin, a polyimide resin or the like is used. Alternatively, the insulation layer 40 may be formed by applying liquid resin.

Figure 6B:
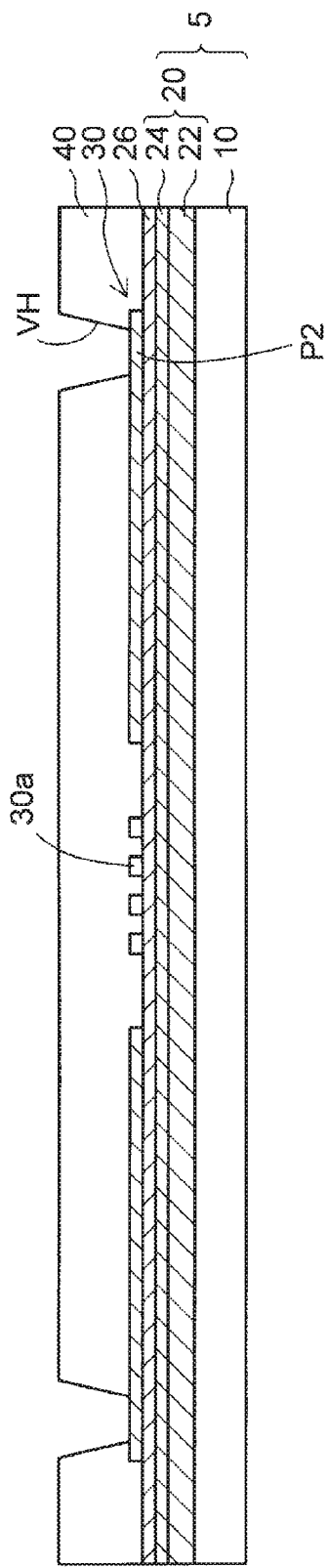

Then, as shown in FIG. 6B, the insulation layer 40 is subjected to laser processing, so that via holes VH reaching the via receiving pad P2 of the first wiring layer 30 are formed. Also, the via holes VH are subjected to desmear processing by permanganic acid to remove resin smear, so that they are cleaned therein.

On the other hand, the insulation layer 40 having the via holes VH may be formed by patterning a photosensitive resin on the basis of photolithography.

Figure 7A:
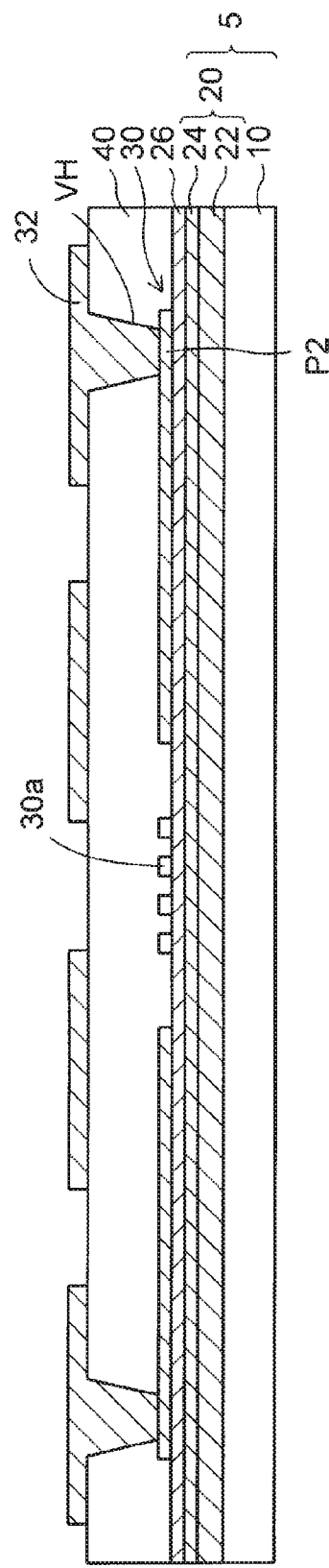
FIGS. 7A and 7B are sectional views depicting the manufacturing method of the wiring substrate according to the first exemplary embodiment (6).

Subsequently, as shown in FIG. 7A, a second wiring layer 32 to be connected to the first wiring layer 30 through via conductors in the via holes VH is formed on the insulation layer 40. The via hole VH and the via conductor filled therein have a conical trapezoidal shape of which a diameter at an opening end-side of the via hole VH is greater than a diameter at a bottom-side.

The second wiring layer 32 is formed by a semi-additive method, for example. Specifically, a seed layer (not shown) of copper or the like is formed on the insulation layer 40 and on inner surfaces of the via holes VH by an electroless plating method or a sputtering method.

Then, a plating resist layer (not shown) having openings formed in areas in which the second wiring layer 32 is to be arranged is formed. Subsequently, a metal plated layer (not shown) of copper or the like is formed in the openings of the plating resist layer by an electrolytic plating in which the seed layer is used for a plating power feeding path, and then the plating resist layer is removed.

Also, the seed layer is removed by the wet etching while using the metal plated layer as a mask. Thereby, the second wiring layer 32 is formed from the seed layer and the metal plated layer.

In the above aspect, the stacked substrate 5 where the copper foil 20 having a carrier is formed on one surface of the prepreg 10 is used, and the multi-layered wiring layer is formed on one surface of the stacked substrate 5. In addition, a stacked substrate where the copper foil 20 having a carrier is formed on both surfaces of the prepreg 10 may be used and the multi-layered wiring layer may be formed on both surfaces of the stacked substrate.

Figure 7B:
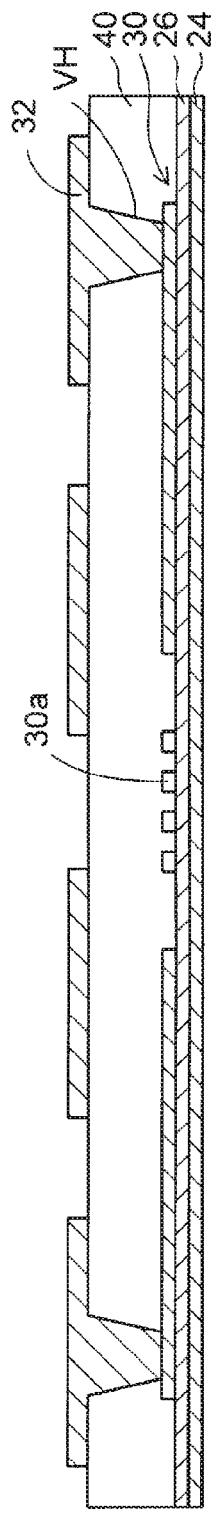

Subsequently, as shown in FIG. 7B, the carrier copper foil 22 and the thin film copper foil 24 of the stacked substrate 5 are peeled off from the interface therebetween, so that the carrier copper foil 22 and the prepreg 10 are separated from the thin film copper foil 24.

Then, as shown in FIG. 8A, the thin film copper foil 24 is wet-etched and removed by a mixed solution of sulfuric acid and hydrogen peroxide solution at a state where the second wiring layer 32 is protected by a protective sheet (not shown) bonded to an upper surface-side of the insulation layer 40.

At this time, the exposed nickel layer 26 is little etched by the mixed solution of sulfuric acid and hydrogen peroxide solution and functions as an etching stop layer. In this way, the thin film copper foil 24 can be selectively etched with respect to the nickel layer 26 and the insulation layer 40.

Subsequently, as shown in FIG. 8B, the nickel layer 26 is wet-etched and removed by nitric acid-based wet etchant. At this time, since the exposed first wiring layer 30 (copper) is little etched by the nitric acid-based wet etchant, the nickel layer 26 can be selectively etched with respect to the first wiring layer 30 and the insulation layer 40.

Thereby, as shown in a partially enlarged sectional view of FIG. 8B, a lower surface C of the first wiring layer 30 is exposed from a lower surface of the insulation layer 40.

In this way, the stacked substrate 5 and the nickel layer 26 thereon formed as the base layer are selectively removed with respect to the first wiring layer 30.

Thereafter, the protective sheet provided on the upper surface-side of the insulation layer 40 is peeled off and removed.

Figure 9:
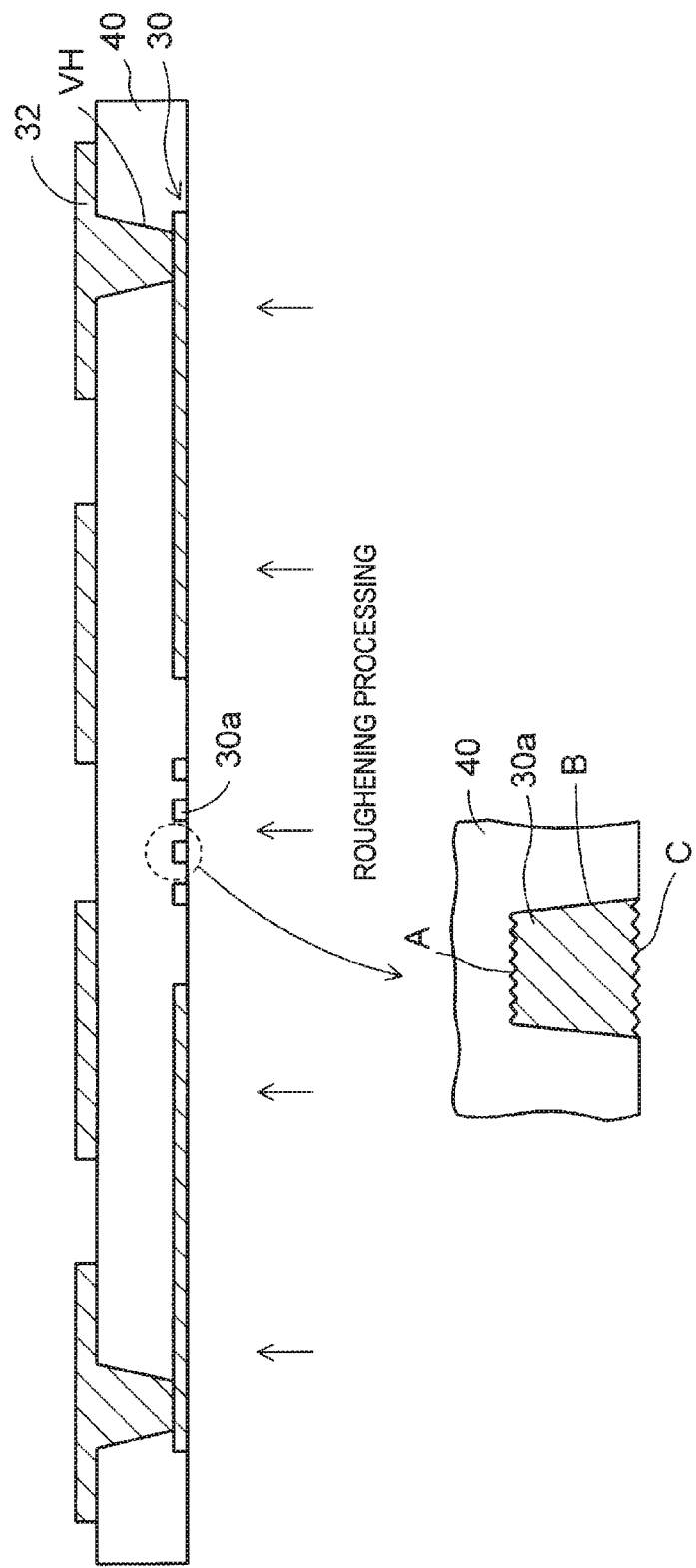
FIG. 9 is a sectional view depicting the manufacturing method of the wiring substrate according to the first exemplary embodiment (8).

Subsequently, as shown in FIG. 9, the lower surface C of the first wiring layer 30 is roughened under the same conditions as the roughening processing of the first wiring layer 30 of the first exemplary embodiment. A surface roughness (Ra) of the lower surface C of the first wiring layer 30 is set to 100 nm to 500 nm, like the upper surface A.

Thereby, as shown in a partially enlarged sectional view of FIG. 9, the lower surface C of the first wiring layer 30 becomes the same roughened surface as the upper surface A.

Figure 10:
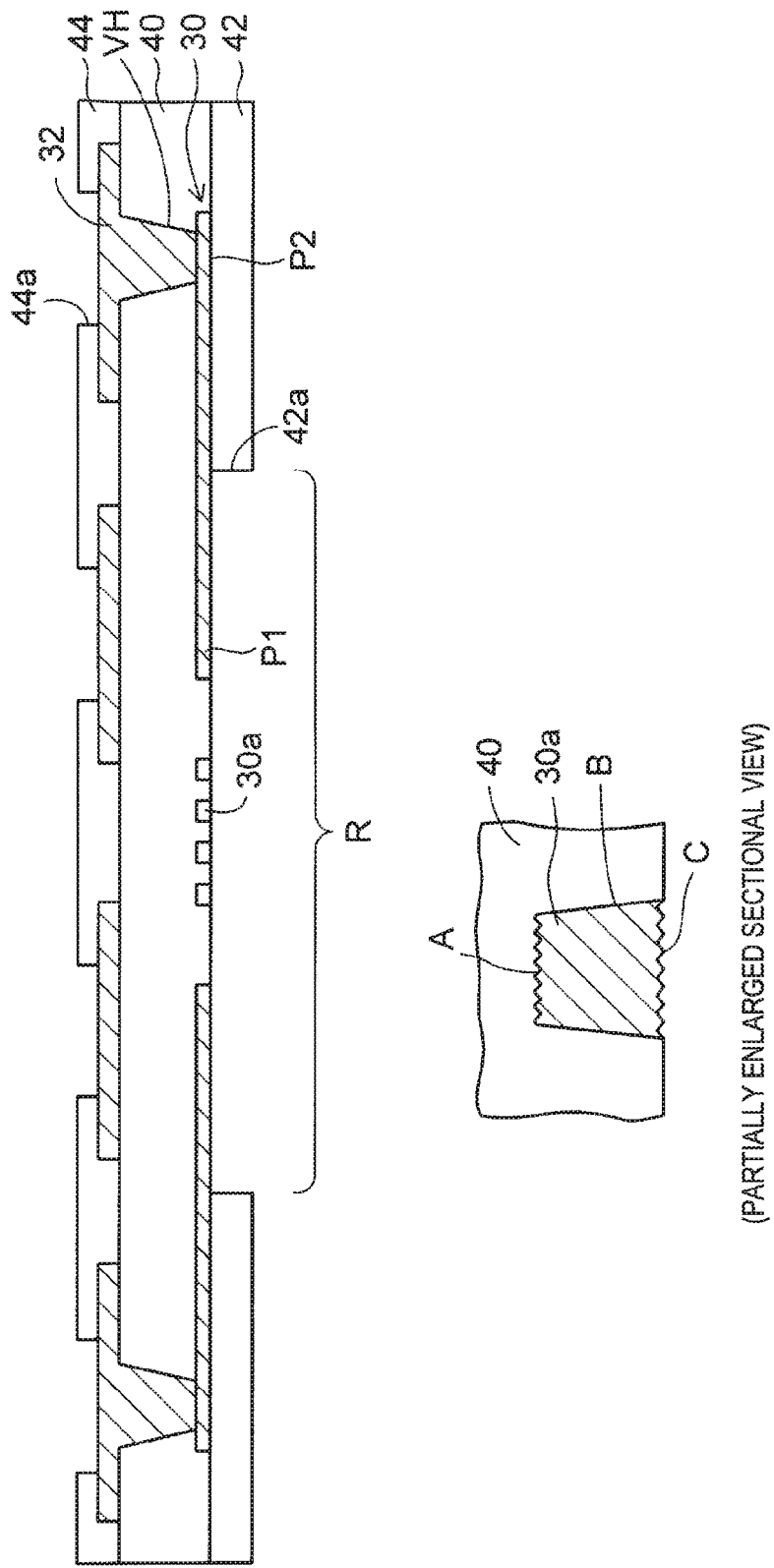
FIG. 10 is a sectional view depicting the manufacturing method of the wiring substrate according to the first exemplary embodiment (9).

Then, as shown in FIG. 10, a solder resist layer 42 is formed on the lower surface-side of the insulation layer 40 so that an opening 42a is arranged in the electronic component mounting area R. At this time, since the lower surface C of the first wiring layer 30 has been sufficiently roughened, the solder resist layer 42 is formed with good adhesiveness.

Also, a solder resist layer 44 having openings 44a arranged on connection parts of the second wiring layer 32 is formed on the upper surface-side of the insulation layer 40.

After the process of FIG. 10, a surface treatment layer may be formed on the lower surface C the first wiring layer 30 exposed through the opening 42a of the solder resist layer 42, as required. Also, a surface treatment layer may be formed on the connection parts the second wiring layer 32 exposed through the openings 44a of the solder resist layer 44, as required.

As the surface treatment layer, a nickel layer/a gold layer or a nickel layer/a palladium layer/a gold layer, which are formed sequentially from below by the electroless plating, or an organic film of an azole compound or an imidazole compound formed by OSP (Organic Solderability Preservative) processing is used.

Then, as shown in FIG. 11, the structure of FIG. 10 is inverted up and down. Thereby, the electronic component mounting area R of a wiring substrate 1 is arranged at the upper side and the fine wiring part 30a of the first wiring layer 30 and the electronic component mounting pad P, which are exposed from the insulation layer 40, face upwards.

As a result, a wiring substrate 1 of the first exemplary embodiment is obtained.

As shown in FIG. 11, the wiring substrate 1 of the first exemplary embodiment has the insulation layer 40 having the electronic component mounting area R. The first wiring layer 30 is embedded in the insulation layer 40. The first wiring layer 30 is formed of only the metal plated layer 30a, which is formed by the electrolytic plating, and has no seed layer. The first wiring layer 30 is entirely formed of the same metal such as copper.

Regarding the wiring substrate 1 of FIG. 11, the lower surface C of the first wiring layer 30 described above in the manufacturing method is referred to as a first surface S1 and the upper surface A is referred to as a second surface S2.

The first wiring layer 30 has the first surface S1 exposed from the upper surface of the insulation layer 40. Also, the first wiring layer 30 has the second surface S2 opposite to the first surface S1, and the second surface S2 is embedded in the insulation layer 40 and is covered by the insulation layer 40. Also, the first wiring layer 30 has the side surfaces B connected to the first surface S1 and the second surface S2, and the side surfaces B are embedded in the insulation layer 40.

The first wiring layer 30 has the electronic component mounting pad P1 and the via receiving pad P2. Also, the first wiring layer 30 is formed to include the fine wiring part 30a arranged at the central part of the electronic component mounting area R. No other members are formed on the first surface S1 of the first wiring layer 30, and a terminal of an electronic component is connected to the first surface S1 of the first wiring layer 30. In the example of FIG. 11, the terminal of the electronic component is flip chip-connected to the electronic component mounting pad P1 of the first wiring layer 30.

The upper surface of the insulation layer 40 and the first surface S1 of the first wiring layer 30 are arranged at the same position and are thus flush with each other.

As shown in a partially enlarged sectional view of FIG. 11, the surface roughness (Ra) of the second surface S2 of the first wiring layer 30 is set to be higher than the surface roughness (Ra) of the side surface B. Also, the surface roughness (Ra) of the first surface S1 of the first wiring layer 30 is set to be higher than the surface roughness (Ra) of the side surface B.

The insulation layer 40 is formed with the via holes VH reaching the via receiving pad P2 of the first wiring layer 30. The lower surface of the insulation layer 40 is formed with the second wiring layer 32 connected to the first wiring layer 30 through the via conductors in the via holes VH.

Also, the solder resist layer 42 having the opening 42a arranged in the electronic component mounting area R is formed on the upper surface-side of the insulation layer 40. Also, the solder resist layer 44 having the openings 44a arranged on the connection parts of the second wiring layer 32 is formed on the lower surface-side of the insulation layer 40. The second wiring layer 32 exposed through the openings 44a of the solder resist layer 44 on the lower surface-side is an exterior connection pad P3.

In the wiring substrate 1 of the first exemplary embodiment, the second surface S2 of the first wiring layer 30 is roughened with the sufficient surface roughness. For this reason, it is possible to obtain the sufficient adhesion strength of the insulation layer 40 by an increase in a surface area contacting the insulation layer 40 and an anchor effect.

In the meantime, the side surface B of the first wiring layer 30 is set to be lower than the second surface S2 in terms of the surface roughness. For example, the fine wiring part 30a of the first wiring layer 30 is a transmission path of a high-frequency signal. At this time, since the unevenness of the side surface B of the fine wiring part 30a of the first wiring layer 30 is small, a moving distance of the signal is shortened on the side surface B. As a result, it is possible to reduce the propagation loss of the high-frequency signal.

Also, since the side surface B of the first wiring layer 30 is not a completely flat surface and is a little roughened, it also contributes to the adhesiveness of the insulation layer 40.

A line (width): a space (interval) of the fine wiring part 30a of the first wiring layer 30 is set within a range of 2 μm:2 μm to 10 μm:10 μm, for example.

Also, an aspect ratio (height/width) of the fine wiring part 30a of the first wiring layer 30 is set to 1 to 3, for example.

When the above-described roughening conditions are used, the greater the aspect ratio of the first wiring layer 30, the side surface B is more difficult to be roughened and becomes close to a flat surface. When the aspect ratio of the first wiring layer 30 increases, an area of the side surface through which the signal is to be transmitted also increases. Therefore, it is possible to more effectively reduce the propagation loss.

Manufacturing Method of Modified Example

In the structure of FIG. 2B, since the peeling interface of the copper foil 20 having a carrier is exposed, a chemical solution may be introduced to the peeling interface of the copper foil 20 having a carrier in a manufacturing process to be performed later, so that the peeling may occur.

For this reason, as shown in FIG. 12A, during the process of forming the nickel layer 26 of FIG. 2B, the side surface of the copper foil 20 having a carrier may be covered with a covering part 26a of the nickel layer 26 by precipitating the electrolytic plating onto the side surfaces of the copper foil 20 having a carrier, too.

Then, as shown in FIG. 12B, the same processes as those of FIGS. 3A to 7A are performed. Then, as shown in FIG. 12C, before the peeling from the peeling interface of the copper foil 20 having a carrier (refer to FIG. 7B), the covering part 26a of the nickel layer 26 covering the side surfaces of the copper foil 20 having a carrier is mechanically removed.

Thereby, the peeling of the copper foil 20 having a carrier is prevented until the process of FIG. 7A, and the peeling can be easily made at the interface of the copper foil 20 having a carrier in the process of FIG. 7B.

In the below, a method of establishing an electronic component device by using the wiring substrate 1 of FIG. 11 is described.

Figure 13:
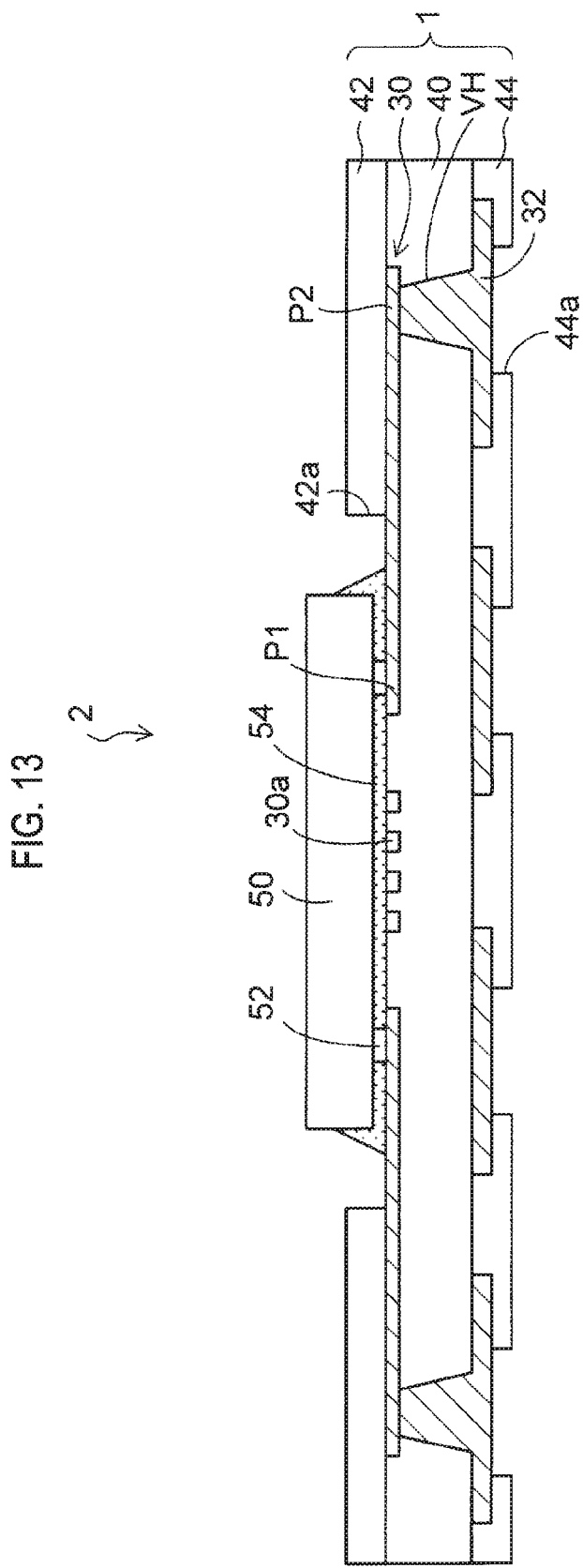
FIG. 13 is a sectional view depicting an electronic component device of the first exemplary embodiment.

As shown in FIG. 13, a semiconductor chip 50 having a terminal 52 on a lower surface thereof is prepared as an electronic component. The terminal 52 of the semiconductor chip 50 is composed of a soldering bump, a gold bump or the like. The terminal 52 of the semiconductor chip 50 is flip chip-connected to the electronic component mounting pad P1 of the first wiring layer 30 of the wiring substrate 1 via a soldering (not shown).

Then, an underfill resin 54 is filled between the semiconductor chip 50 and the wiring substrate 1.

By the above processes, an electronic component device 2 of the first exemplary embodiment is obtained. Since the electronic component device 2 uses the wiring substrate 1 in which the propagation loss of the high-frequency signal is to be reduced, it is possible to establish a high-performance electronic component device.

Figure 15:
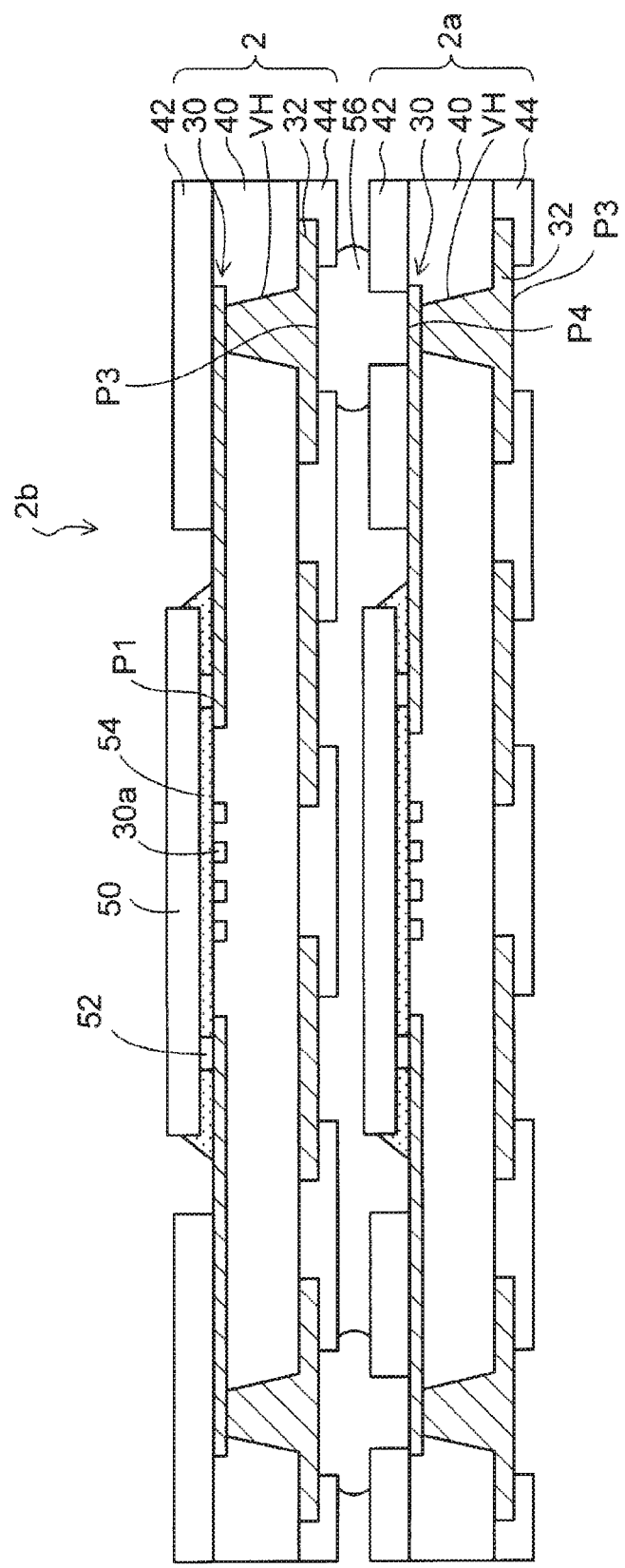
FIG. 15 is a sectional view depicting the electronic component device of the first modified example of the first exemplary embodiment (2).

FIGS. 14A, 14B and 15 depict an electronic component device of a first modified example of the first exemplary embodiment. As shown in FIG. 14A, openings 42b are formed in the solder resist layer 42 on the via receiving pad P2 of the first wiring layer 30 at the upper surface-side of the insulation layer 40 of the wiring substrate 1 shown in FIG. 11. Thereby, the via receiving pad P2 of the first wiring layer 30 of the wiring substrate 1 functions as a connection pad P4 for stacking another electronic component device.

Then, as shown in FIG. 14B, the terminal 52 of the semiconductor chip 50 is flip chip-connected to the electronic component mounting pad P of the wiring substrate 1, like FIG. 13. Also, the underfill resin 54 is filled below the semiconductor chip 50, so that an electronic component device 2a is obtained.

Also, as shown in FIG. 15, the electronic component device 2 of FIG. 13 is arranged above the electronic component device 2a of FIG. 14B, and the connection pad P4 of the below electronic component device 2a and the exterior connection pad P3 of the above electronic component device 2 are connected to each other by a soldering 56. Thereby, a stacked electronic component device 2b is obtained.

Figure 16:
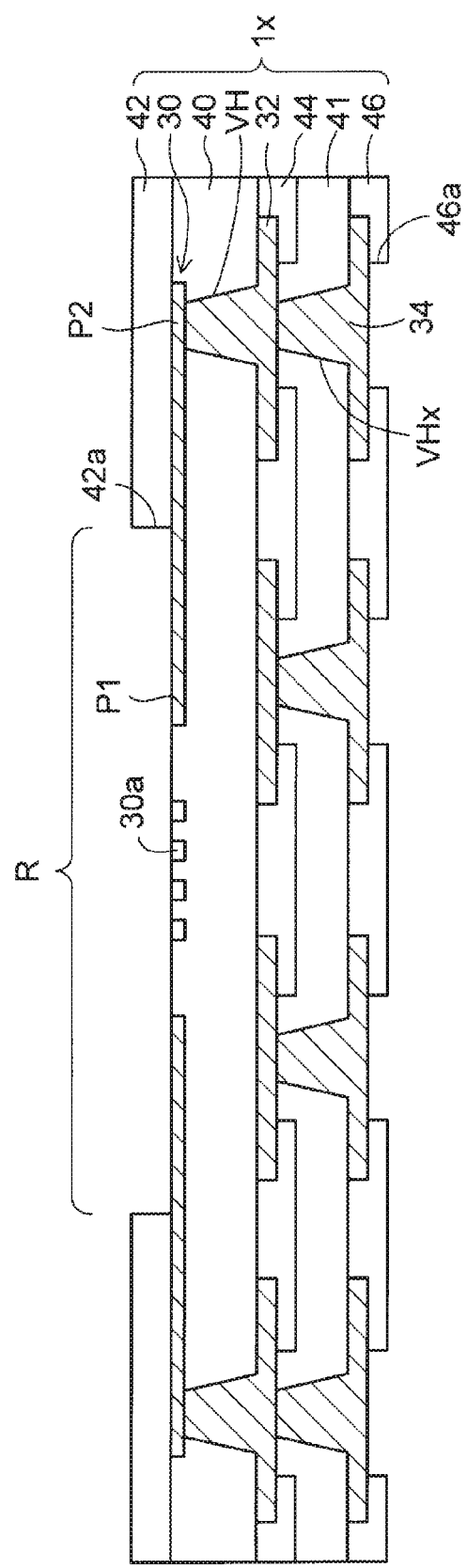
FIG. 16 is a sectional view depicting an electronic component device of a second modified example of the first exemplary embodiment (1).
Figure 17:
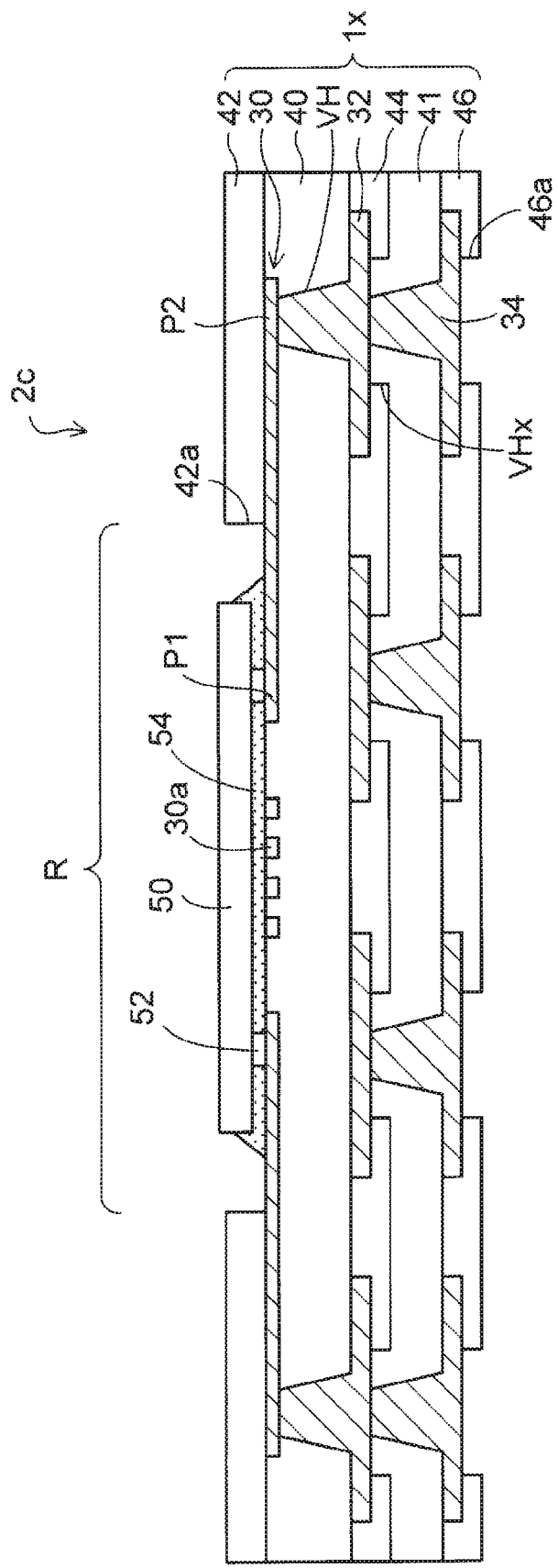
FIG. 17 is a sectional view depicting the electronic component device of the second modified example of the first exemplary embodiment (2).

FIGS. 16 and 17 depict an electronic component device of a second modified example of the first exemplary embodiment.

As shown in FIG. 16, in an electronic component device of the second modified example, a multi-layered wiring substrate 1x in which a wiring substrate 1 of FIG. 11 is provided in a multi-layered form is used. In the multi-layered wiring substrate 1x, the wiring substrate 1 shown in FIG. 11 is formed with a lower-side insulation layer 41, instead of the solder resist layer 44 of the lower surface-side. The lower-side insulation layer 41 is formed with via holes VHx reaching the second wiring layer 32.

Also, a lower surface of the lower-side insulation layer 41 is formed with a third wiring layer 34 that is to be connected to the second wiring layer 32 through via conductors in the via holes VHx.

Also, a solder resist layer 46 having openings 46a formed on connection parts of the third wiring layer 34 is formed below the lower-side insulation layer 41.

Then, as shown in FIG. 17, the terminal 52 of the semiconductor chip 50 is flip chip-connected to the electronic component mounting pad P1 of the multi-layered wiring substrate 1x, like FIG. 13. Also, the underfill resin 54 is filled below the semiconductor chip 50, so that an electronic component device 2c is obtained.

In the above embodiments, the semiconductor chip has been exemplified as the electronic component. However, a variety of electronic components including a capacitor element, a resistance element, an inductor element and the like may also be mounted.

Second Exemplary Embodiment

Figure 20:
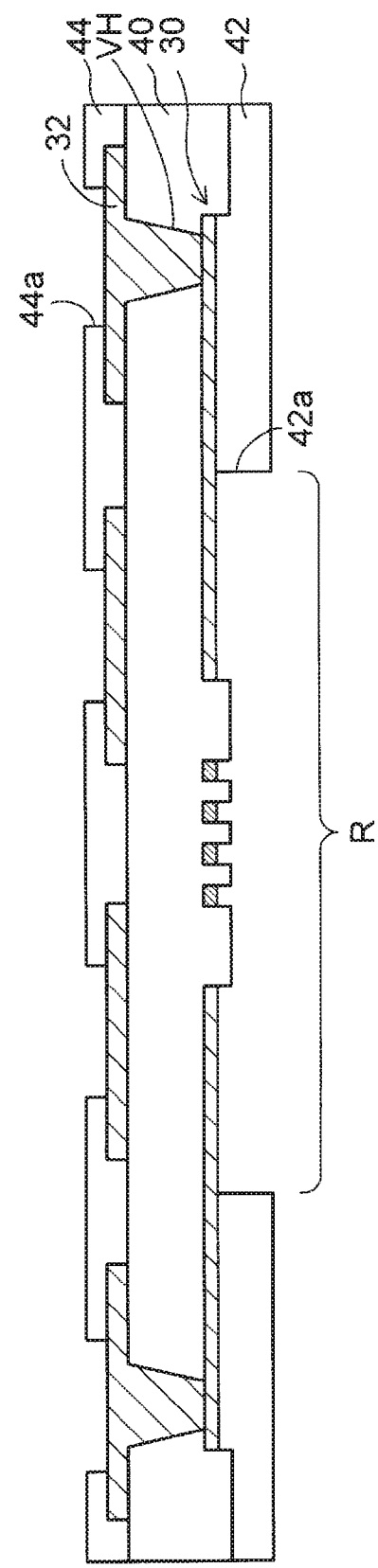
FIG. 20 is a sectional view depicting the manufacturing method of the wiring substrate according to the second exemplary embodiment (3).

FIGS. 18A, 18B and 19A, 19B depict a manufacturing method of a wiring substrate according to a second exemplary embodiment, and FIG. 20 depicts a wiring substrate of the second exemplary embodiment. The second exemplary embodiment is different from the first exemplary embodiment, in that the process of forming the nickel layer 26 on the copper foil 20 having a carrier, which is the process of FIG. 2B of the first exemplary embodiment, is omitted.

Figure 18A:
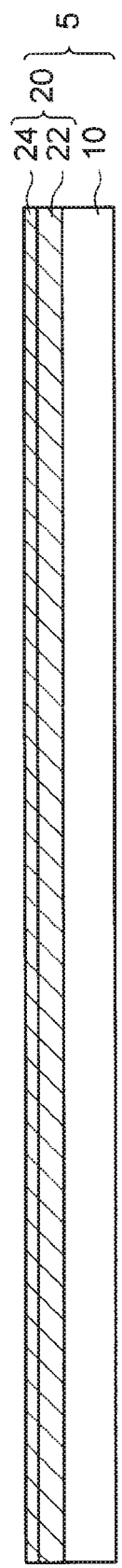
FIGS. 18A and 18B are sectional views depicting a manufacturing method of a wiring substrate according to a second exemplary embodiment (1).

In the manufacturing method of the wiring substrate of the second exemplary embodiment, as shown in FIG. 18A, the stacked substrate 5 having the copper foil 20 having a carrier bonded on the prepreg 10 is prepared, like FIG. 2A. In the second exemplary embodiment, the stacked substrate 5 having no nickel layer is used as the base layer for forming the first wiring layer.

Figure 18B:
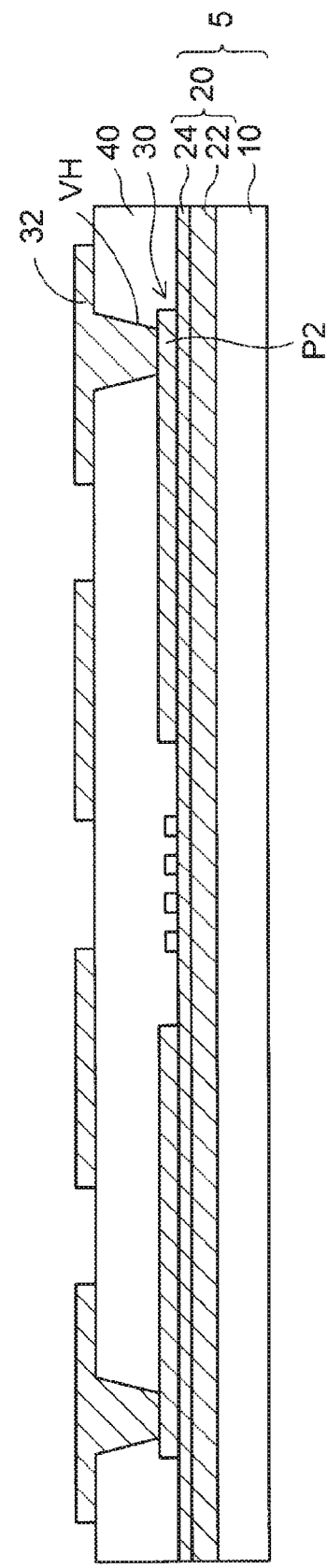

Then, as shown in FIG. 18B, the same processes as those of FIGS. 3A to 7A are performed without forming a nickel layer on the copper foil 20 having a carrier of the stacked substrate 5.

Thereby, the first wiring layer 30 is directly formed on the thin film copper foil 24 of the stacked substrate 5. Also, the insulation layer 40 having the via holes VH arranged on the via receiving pad P2 of the first wiring layer 30 is formed on the thin film copper foil 24. Also, the second wiring layer 32 to be connected to the first wiring layer 30 through the via conductors in the via holes VH is formed on the insulation layer 40.

Subsequently, as shown in FIG. 19A, the carrier copper foil 22 and the thin film copper foil 24 are peeled off from the interface therebetween, so that the carrier copper foil 22 and the prepreg 10 are separated from the thin film copper foil 24, like the process of FIG. 7B.

Then, as shown in FIG. 19B, the thin film copper foil 24 is wet-etched and removed from the structure of FIG. 19A by a mixed solution of sulfuric acid and hydrogen peroxide solution. In the second exemplary embodiment, there is no nickel layer functioning as an etching stop layer between the thin film copper foil 24 and the first wiring layer 30.

For this reason, when wet-etching the thin film copper foil 24, the first wiring layer 30 (copper) is etched to some extent, so that the first wiring layer 30 is inwardly retreated from the lower surface of the insulation layer 40. An indented amount of the first wiring layer 30 from the lower surface of the insulation layer 40 is about 2 μm to 3 μm.

In this way, according to the second exemplary embodiment, the first wiring layer 30 is arranged on bottoms of the concave portions of the insulation layer 40.

Subsequently, after performing the roughening processing of FIG. 9, as shown in FIG. 20, the solder resist layer 42 is formed on the lower surface-side of the insulation layer 40 so that the opening 42a is arranged in the electronic component mounting area R, like the process of FIG. 10 of the first exemplary embodiment. Also, the solder resist layer 44 having the openings 44a arranged on the connection parts of the second wiring layer 32 is formed on the upper surface-side of the insulation layer 40.

Also, as shown in FIG. 21, the structure of FIG. 20 is inverted up and down. By the above processes, a wiring substrate 1a of the second exemplary embodiment is obtained.

According to the wiring substrate 1a of the second exemplary embodiment, as shown in a partially enlarged sectional view of FIG. 21, the surface roughness of the second surface S2 of the first wiring layer 30 is set to be greater than the surface roughness of the side surface B, like the first exemplary embodiment. Also, the surface roughness of the first surface S1 of the first wiring layer 30 is set to be greater than the surface roughness of the side surface B.

The wiring substrate 1a of the second exemplary embodiment accomplishes the same operational effects as the wiring substrate 1 of the first exemplary embodiment.

Also, according to the second exemplary embodiment, since the first wiring layer 30 is inwardly retreated from the upper surface of the insulation layer 40, it is possible to reduce a damage to the first wiring layer 30 when a shock is applied thereto from an outside.

Also in the wiring substrate 1a of the second exemplary embodiment, the electronic component such as the semiconductor chip is connected to the first wiring layer 30, so that an electronic component device is established.

Third Exemplary Embodiment

FIGS. 22A to 24 depict a manufacturing method of a wiring substrate according to a third exemplary embodiment, and FIG. 25 depicts a wiring substrate of the third exemplary embodiment. The third exemplary embodiment is different from the first exemplary embodiment, in that a nickel foil is used instead of the thin film copper foil 24 of the copper foil 20 having a carrier.

Figure 22A:
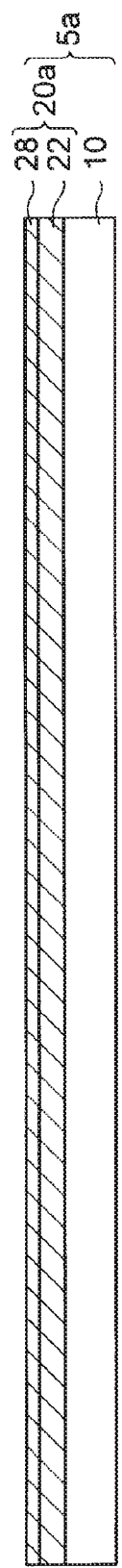
FIGS. 22A and 22B are sectional views depicting a manufacturing method of a wiring substrate according to a third exemplary embodiment (1).

In the manufacturing method of the wiring substrate of the third exemplary embodiment, as shown in FIG. 22A, a stacked substrate 5a having a metal foil 20a having a carrier bonded on the prepreg 10 is prepared.

The metal foil 20a having a carrier includes a carrier copper foil 22 arranged on the prepreg 10-side and a nickel foil 28 arranged on the carrier copper foil.

Like the stacked substrate 5 of the first exemplary embodiment shown in FIG. 2A, the stacked substrate 5a is formed with a release agent (not shown) between the carrier copper foil 22 and the nickel foil 28. For this reason, the carrier copper foil 22 and the nickel foil 28 can be easily peeled off from an interface therebetween.

In this way, in the third exemplary embodiment, the stacked substrate 5a having the carrier copper foil 22 and the nickel foil 28 formed sequentially from below on the prepreg 10 is used as the base layer for forming the first wiring layer.

In addition to the nickel foil 28, a metal foil having a characteristic that it can be selectively wet-etched with respect to the first wiring layer (copper) can be used.

Then, the same processes as those of FIGS. 3A to 7A of the first exemplary embodiment are performed on the nickel foil 28 of the stacked substrate 5a.

Figure 22B:
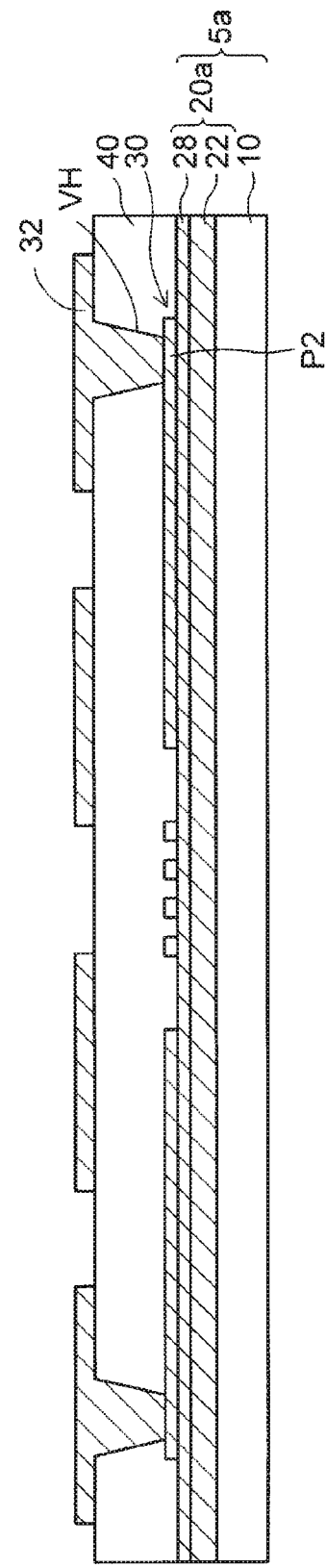

Thereby, as shown in FIG. 22B, the first wiring layer 30 is formed on the nickel foil 28 of the stacked substrate 5a. Also, the insulation layer 40 having the via holes VH arranged on the via receiving pad P2 of the first wiring layer 30 is formed on the nickel foil 28. Also, the second wiring layer 32 to be connected to the first wiring layer 30 through the via conductors in the via holes VH is formed on the insulation layer 40.

In the meantime, the stacked substrate having the metal foil 20a having a carrier may be used on both surfaces of the prepreg 10, and both surfaces of the stacked substrate may be formed with multi-layered wiring layers.

Subsequently, as shown in FIG. 23A, the carrier copper foil 22 and the nickel foil 28 are peeled off from the interface therebetween, so that the carrier copper foil 22 and the prepreg 10 are separated from the nickel foil 28.

Also, as shown in FIG. 23B, the nickel foil 28 is etched from the structure of FIG. 23A by nitric acid-based wet etchant, so that it is selectively etched with respect to the first wiring layer 30 (copper) and the insulation layer 40.

Figure 24:
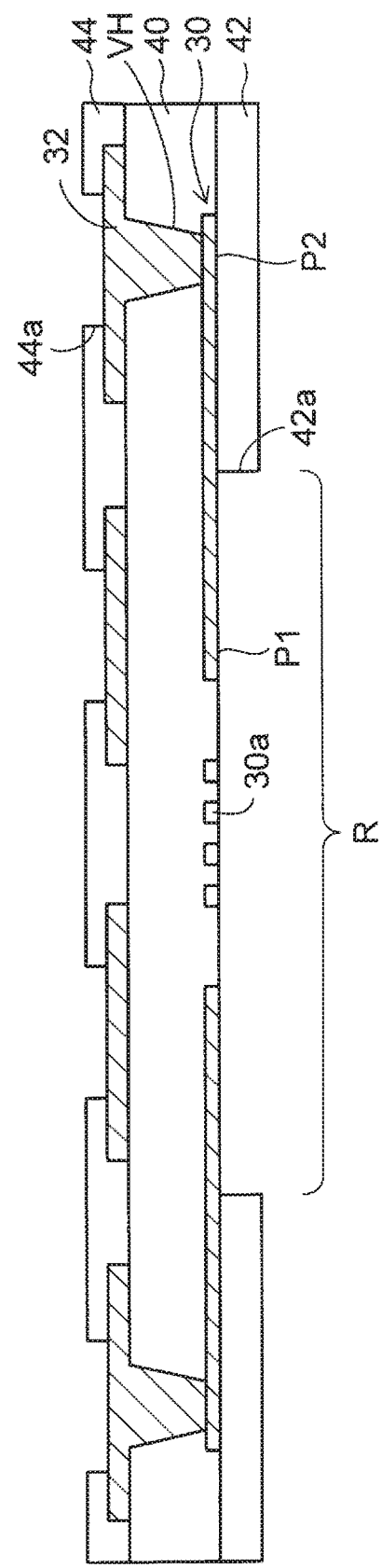
FIG. 24 is a sectional view depicting the manufacturing method of the wiring substrate according to the third exemplary embodiment (3).

Then, after performing the roughening processing of FIG. 9, as shown in FIG. 24, the solder resist layer 42 is formed on the lower surface-side of the insulation layer 40 so that the opening 42a is arranged in the electronic component mounting area R, like the process of FIG. 10 of the first exemplary embodiment. Also, the solder resist layer 44 having the openings 44a arranged on the connection parts of the second wiring layer 32 is formed on the upper surface-side of the insulation layer 40.

Then, as shown in FIG. 25, the structure of FIG. 24 is inverted up and down. Thereby, a wiring substrate 1b of the third exemplary embodiment is obtained. Since the wiring substrate 1b of the third exemplary embodiment has the same structure as the wiring substrate 1 of the first exemplary embodiment shown in FIG. 11, the detailed description thereof is omitted. The wiring substrate 1b of the third exemplary embodiment accomplishes the same operational effects as the wiring substrate 1 of the first exemplary embodiment.

Also, according to the third exemplary embodiment, the nickel foil 28 is used instead of the thin film copper foil 24 of the copper foil 20 having a carrier of the stacked substrate 5 used in the first exemplary embodiment, and the process of forming the nickel layer by the electrolytic plating is omitted.

For this reason, according to the third exemplary embodiment, the number of processes is reduced, as compared to the first exemplary embodiment, so that it is possible to save the manufacturing cost.

Fourth Exemplary Embodiment

FIGS. 26A to 29 depict a manufacturing method of a wiring substrate according to a fourth exemplary embodiment. FIG. 30 depicts a wiring substrate of the fourth exemplary embodiment. In the fourth exemplary embodiment, the same roughening processing as the first exemplary embodiment is performed for a wiring layer, which is formed on a core substrate by the semi-additive method.

Figure 26A:
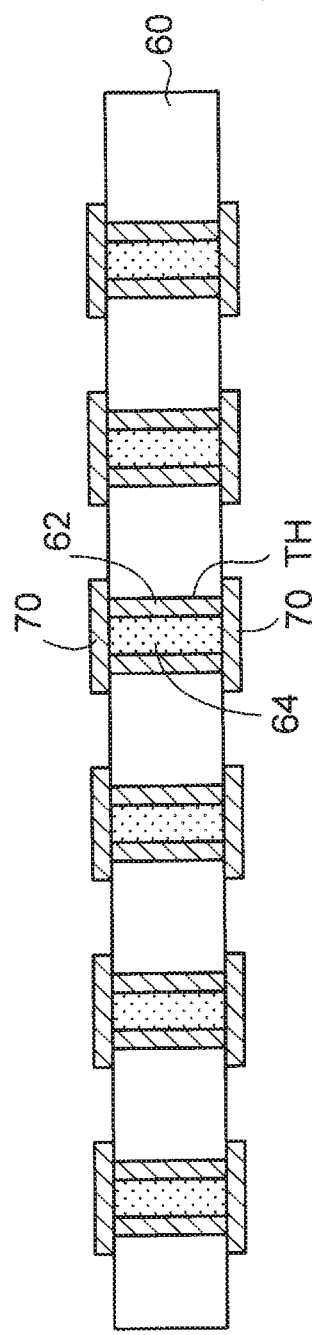
FIGS. 26A and 26B are sectional views depicting a manufacturing method of a wiring substrate according to a fourth exemplary embodiment (1).

First, a core substrate 60 having a structure as shown in FIG. 26A is prepared. The core substrate 60 is formed with through-holes TH penetrating the substrate in a thickness direction, and a through-hole plating layer 62 is formed on inner walls of the through-holes. The core substrate 60 is formed of an insulating material such as a glass epoxy resin.

Also, both surfaces of the core substrate 10 are formed with a first wiring layer 70, respectively. The first wiring layers 70 on both surfaces are connected to each other via the through-hole plating layer 62, and the remaining portions of the through-holes TH are filled with a resin 64.

Alternatively, the through-holes TH may be entirely embedded with through-conductors, and the first wiring layers 70 on both surfaces may be connected to each other via the through-conductors.

Figure 26B:
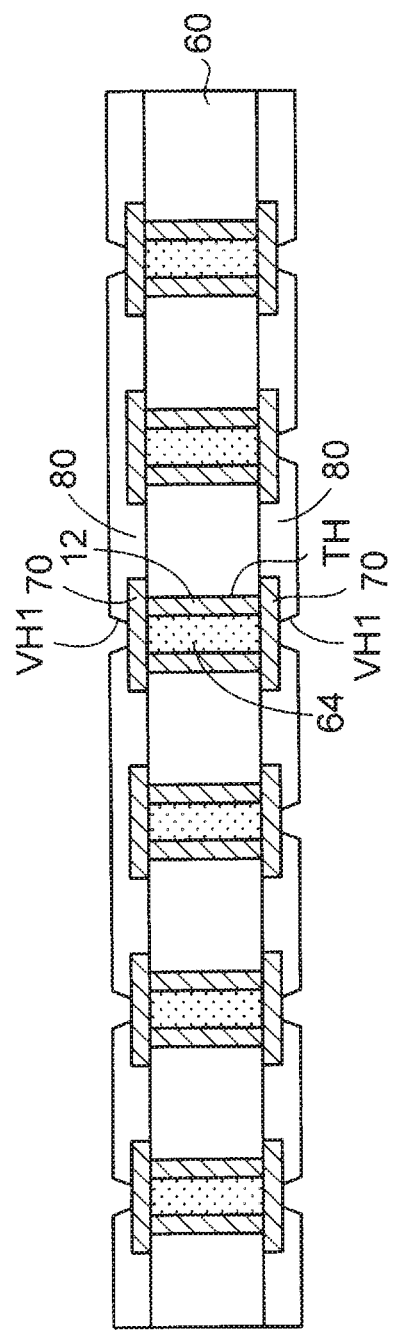

Then, as shown in FIG. 26B, a non-cured resin film such as an epoxy resin, a polyimide resin or the like is bonded on both surfaces of the core substrate 60 and cured by heating, so that a first insulation layer 80 is respectively formed.

Then, the first insulation layers 80 on both surfaces are subjected to laser processing, so that first via holes VH1 reaching connection parts of the first wiring layers 70 on both surfaces are respectively formed.

Also, the first via holes VH1 are subjected to desmear processing by permanganic acid to remove resin smear, so that they are cleaned therein.

Alternatively, the first insulation layer 80 having the first via holes VH1 may be formed by applying and patterning a photosensitive resin on the basis of photolithography.

According to the fourth exemplary embodiment, the base layer for forming the wiring layer is the first insulation layer 80 formed on the core substrate 60. In the fourth exemplary embodiment, the first insulation layer 80 formed as the base layer remains in the wiring substrate without being removed, unlike the first to third exemplary embodiments.

Then, as shown in FIG. 27A, second wiring layers 72, which are to be connected to the first wiring layers 70 through the via conductors in the first via holes VH1, are formed on the first insulation layers 80 on both surfaces. The second wiring layers 72 are formed by the semi-additive method.

Figure 28A:
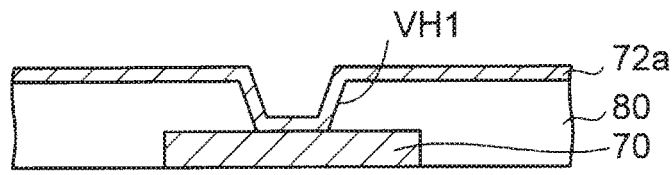
FIGS. 28A to 28E are sectional views depicting the manufacturing method of the wiring substrate according to the fourth exemplary embodiment (3).

Specifically, as shown in FIG. 28A, a seed layer 72a of copper or the like is formed on the first insulation layer 80 and on an inner surface of the first via hole VH1 by the electroless plating or sputtering method.

Figure 28B:
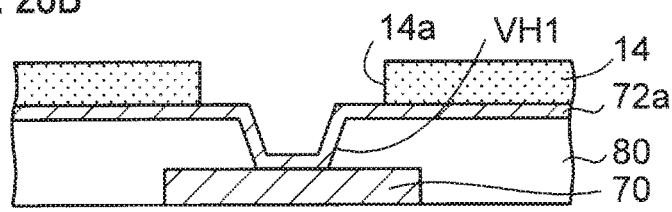

Then, as shown in FIG. 28B, a plating resist layer 14 having an opening 14a provided in an area, in which the second wiring layer 72 is arranged, is formed.

Figure 28C:
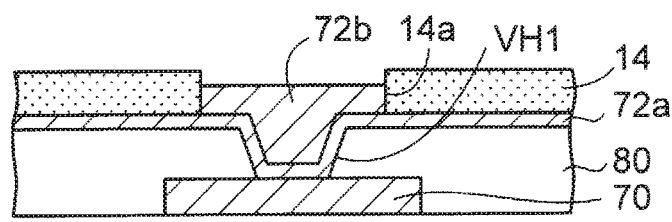
Figure 28D:
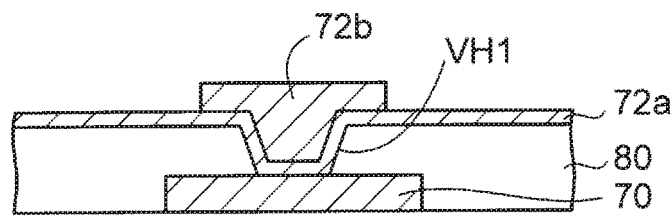

Subsequently, as shown in FIG. 28C, a metal plated layer 72b of copper or the like is formed in the opening 14a of the plating resist layer 14 by the electrolytic plating in which the seed layer 72a is used for the plating power feeding path. Then, as shown in FIG. 28D, the plating resist layer 14 is removed.

Figure 28E:
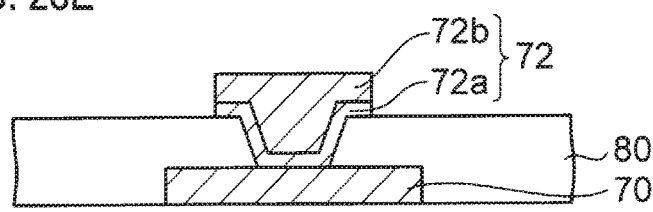

Also, as shown in FIG. 28E, the seed layer 72a is removed by the wet etching while using the metal plated layer 72b as a mask. Thereby, the second wiring layer 72 is formed from the seed layer 72a and the metal plated layer 72b.

Returning to FIG. 27A, the roughening processing is performed for the second wiring layer 72 under the same conditions as the first exemplary embodiment. Thereby, as shown in a partially enlarged sectional view of FIG. 27B, the surface roughness of the upper surface A of the second wiring layer 72 is set to be greater than the surface roughness of the side surface B, like the first exemplary embodiment.

Figure 29:
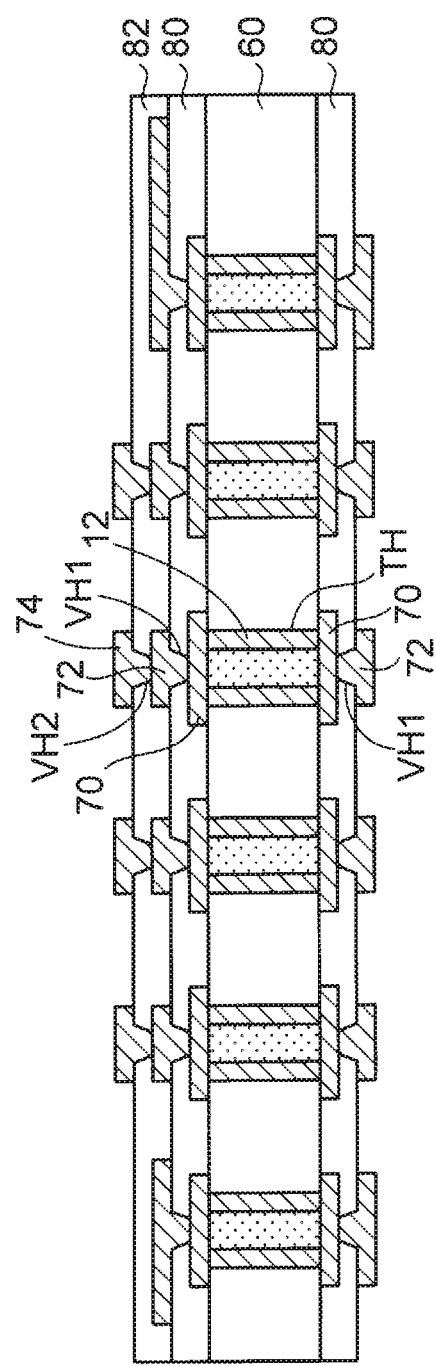
FIG. 29 is a sectional view depicting the manufacturing method of the wiring substrate according to the fourth exemplary embodiment (4).

Then, as shown in FIG. 29, a second insulation layer 82 having second via holes VH2 arranged on connection parts of the second wiring layer 72 is formed on the first insulation layer 80. Also, a third wiring layer 74, which is to be connected to the second wiring layer 72 through via conductors in the second via holes VH2, is formed on the second insulation layer 82.

Then, as shown in FIG. 30, a solder resist layer 84 having openings 84a arranged on connection parts of the third wiring layer 74 is formed on the upper surface-side of the core substrate 60. Also, a solder resist layer 86 having openings 86a arranged on the connection parts of the second wiring layer 72 is formed on the lower surface-side of the core substrate 60.

By the above processes, a wiring substrate 1c of the fourth exemplary embodiment is obtained.

In the wiring substrate 1c of the fourth exemplary embodiment, the semiconductor chip or the like is flip chip-connected to the third wiring layer 74 on the upper surface-side of the core substrate 10, and the connection parts of the second wiring layer 72 on the lower surface-side of the core substrate 10 are connected to a mount substrate such as a motherboard.

In the wiring substrate 1c of the fourth exemplary embodiment, as shown in a partially enlarged sectional view of FIG. 30, the surface roughness of the upper surface A of the second wiring layer 72 is set to be greater than the surface roughness of the side surface B. For this reason, when the second wiring layer 72 is a transmission path of the high-frequency signal, it is possible to reduce the propagation loss, like the first exemplary embodiment.

Also, since the upper surface A of the second wiring layer 72 is sufficiently roughened, it is possible to secure the sufficient adhesiveness of the second insulation layer 82.

The number of the wiring layers to be formed on both surfaces of the core substrate 60 can be arbitrarily set. By roughening any wiring layer of the wiring substrate 1c under the same conditions as the first exemplary embodiment, it is possible to set the surface roughness of the upper surface of any wiring layer to be greater than the surface roughness of the side surface.

Also, since the second wiring layer 72 of the wiring substrate 1c of the fourth exemplary embodiment is formed by the semi-additive method, it is formed of the seed layer 72a and the metal plated layer 72b thereon.

According to the formation method of the wiring layer described in the preliminary matters, the etching amounts of the upper surface and side surfaces of the wiring layer in the seed layer etching process and the wiring layer roughening process are the same.

For this reason, when a line (width): a space (gap) of the wiring layer has a narrow pitch such as 8 μm:8 μm or less, for example, the width of the wiring layer becomes thinner, so that it is likely to deviate from a design specification. Thereby, it is difficult to form a fine wiring.

However, according to the fourth exemplary embodiment, since the second wiring layer 72 is suppressed from thinning as the side surface of the second wiring layer 72 is suppressed from being roughened, it is advantageous to form a fine wiring.

CLAUSES

This disclosure further encompasses various exemplary embodiments, for example, described below.

1. A manufacturing method of a wiring substrate, comprising:

forming a wiring layer on a base layer;

roughening the wiring layer by a roughening processing solution so that a surface roughness of an upper surface of the wiring layer is greater than a surface roughness of a side surface thereof; and forming an insulation layer on the base layer and the wiring layer.

2. The manufacturing method of a wiring substrate according to claim 1, wherein the base layer comprises a metal layer or a metal foil on a top, wherein the forming the wiring layer comprises forming a plating resist layer having an opening on the metal layer or the metal foil, forming a metal plated layer in the opening of the plating resist layer by an electrolytic plating in which the metal layer or the metal foil is used for a plating power feeding path, and removing the plating resist layer, and, wherein the manufacturing method further comprises:

removing the base layer to expose a lower surface of the wiring layer, after the forming the insulation layer; and roughening the lower surface of the wiring layer.

3. The manufacturing method of a wiring substrate according to claim 1, wherein the base layer is an insulation layer, and wherein the forming the wiring layer comprises forming a seed layer on the insulation layer, forming a plating resist layer having an opening on the seed layer, forming a metal plated layer in the opening of the plating resist layer by an electrolytic plating in which the seed layer is used for a plating power feeding path, removing the plating resist layer, and removing the seed layer while using the metal plated layer as a mask.

4. The manufacturing method of a wiring substrate according to claim 2, wherein the metal layer or the metal foil of the base layer is formed of nickel, and wherein the wiring layer is formed of copper.

5. The manufacturing method of a wiring substrate according to one of claims 1 to 4, wherein in the roughening the wiring layer, the roughening processing solution is sprayed to the wiring layer from above.

What is claimed is:

1. A wiring substrate comprising:

an insulation layer having a surface on which an electronic component mounting area is provided; and a wiring layer embedded in the insulation layer, the wiring layer having a first surface exposed from the surface of the insulation layer, to which a terminal of an electronic component is to be connected, a second surface opposite to the first surface, the second surface covered by the insulation layer, and a side surface covered by the insulation layer, wherein the second surface of the wiring layer has a roughened surface and the side surface of the wiring layer has a roughened surface, and a surface roughness of the second surface of the wiring layer is greater than a surface roughness of the side surface of the wiring layer, wherein a solder resist layer is provided on the surface of the insulation layer on which the electronic component mounting area is provided, an opening exposing the electronic component mounting area on the surface of the insulation layer and the first surface of the wiring layer is defined in the solder resist layer.

2. The wiring substrate according to claim 1, wherein a surface roughness of the first surface of the wiring layer is greater than the surface roughness of the side surface.

3. The wiring substrate according to claim 1, wherein the wiring layer is formed only by an electrolytic metal plated layer.

4. The wiring substrate according to claim 1, wherein the wiring layer comprises a wiring part and a pad to which the terminal of the electronic component is to be connected.

5. The wiring substrate according to claim 1, wherein the surface roughness of the second surface of the wiring layer is 1.5 to 5 times as large as the surface roughness of the side surface.

6. The wiring substrate according to claim 1, wherein an aspect ratio of the wiring layer is set to 1 to 3.

7. The wiring substrate according to claim 1, wherein the first surface of the wiring layer is inwardly retreated from the surface of the insulation layer.

8. An electronic component device comprising:

a wiring substrate comprising:

an insulation layer having a surface on which an electronic component mounting area is provided, and a wiring layer embedded in the insulation layer and having a first surface exposed from the surface of the insulation layer, a second surface opposite to the first surface, the second surface covered by the insulation layer and having a roughened surface, and a side surface covered by the insulation layer and having a roughened surface, wherein a surface roughness of the second surface of the wiring layer is greater than a surface roughness of the side surface of the wiring layer, and an electronic component having a terminal connected to the first surface of the wiring layer of the wiring substrate, wherein a solder resist layer is provided on the surface of the insulation layer on which the electronic component mounting area is provided, an opening exposing the electronic component mounting area on the surface of the insulation layer and the first surface of the wiring layer is defined in the solder resist layer.

9. The wiring substrate according to claim 1, wherein a second wiring layer is provided on a back surface of the insulation layer, the back surface of the insulation layer being opposite to the surface of the insulation layer on which the electronic component mounting area is provided, a conductor connecting the wiring layer and the second wiring layer is provided in the insulation layer, and the conductor has a conical trapezoidal shape with a diameter of the conductor at a position adjacent to the back surface of the insulation layer being greater than a diameter of the conductor at a position adjacent to the surface of the insulation layer on which the electronic component mounting area is provided.

10. The wiring substrate according to claim 9, wherein an exterior connection pad is provided on the second wiring layer.

11. The wiring substrate according to claim 10, wherein a solder resist layer is provided on the back surface of the insulation layer, and an opening exposing the exterior connection pad is defined in the solder resist layer.

12. The wiring substrate according to claim 1, wherein a plurality of second wiring layers and a second insulation layer are provided on a back surface of the insulation layer, the back surface of the insulation layer being opposite to the surface of the insulation layer on which the electronic component mounting area is provided.

13. A wiring substrate comprising:

an insulation layer having a surface on which an electronic component mounting area is provided; and a wiring layer embedded in the insulation layer, the wiring layer having a first surface exposed from the surface of the insulation layer, to which a terminal of an electronic component is to be connected, a second surface opposite to the first surface, the second surface covered by the insulation layer, and a side surface covered by the insulation layer, wherein the second surface of the wiring layer has a roughened surface and the side surface of the wiring layer has a roughened surface, and a surface roughness of the second surface of the wiring layer is greater than a surface roughness of the side surface of the wiring layer, wherein a first exterior connection pad for connecting a first electronic component is provided on the first surface of the wiring layer in the electronic component mounting area, and a second exterior connection pad for connecting a second electronic component is provided on the first surface of the wiring layer outside of the electronic component mounting area.

14. The wiring substrate according to claim 13, wherein a solder resist layer is provided on the surface of the insulation layer on which the electronic component mounting area is provided, a first opening exposing the first exterior connection pad is defined in the solder resist layer, and a second opening exposing the second exterior connection pad is defined in the solder resist layer.

* * * * *